United States Patent
Kusunoki et al.

(10) Patent No.: US 9,890,251 B2
(45) Date of Patent: Feb. 13, 2018

(54) HYDROSILYL-CONTAINING ORGANOPOLYSILOXANE, MAKING METHOD, ADDITION CURABLE SILICONE COMPOSITION, AND SEMICONDUCTOR PACKAGE

(71) Applicant: Shin-Etsu Chemical Co., Ltd., Tokyo (JP)

(72) Inventors: Takayuki Kusunoki, Annaka (JP); Yuusuke Takamizawa, Annaka (JP); Tomoyuki Mizunashi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 83 days.

(21) Appl. No.: 15/216,812

(22) Filed: Jul. 22, 2016

(65) Prior Publication Data

US 2017/0029571 A1 Feb. 2, 2017

(30) Foreign Application Priority Data

Jul. 31, 2015 (JP) .................. 2015-151748
Jul. 31, 2015 (JP) .................. 2015-151780

(51) Int. Cl.

| | | |
|---|---|---|
| *C08G 77/12* | (2006.01) | |
| *C08G 77/04* | (2006.01) | |
| *H01L 33/56* | (2010.01) | |
| *C08L 81/04* | (2006.01) | |
| *C08L 83/04* | (2006.01) | |
| *H01L 23/00* | (2006.01) | |
| *C08G 77/20* | (2006.01) | |
| *C08G 77/00* | (2006.01) | |
| *H01L 33/50* | (2010.01) | |

(52) U.S. Cl.
CPC ........... *C08G 77/045* (2013.01); *C08G 77/12* (2013.01); *C08L 81/04* (2013.01); *C08L 83/04* (2013.01); *H01L 24/29* (2013.01); *H01L 33/56* (2013.01); *C08G 77/20* (2013.01); *C08G 77/80* (2013.01); *H01L 33/501* (2013.01); *H01L 2933/005* (2013.01)

(58) Field of Classification Search
CPC ...................................................... C08G 77/12
USPC .............................................................. 528/31
See application file for complete search history.

(56) References Cited

U.S. PATENT DOCUMENTS

| | | | |
|---|---|---|---|
| 5,109,093 | A | 4/1992 | Rees et al. |
| 7,588,967 | B2 | 9/2009 | Kashiwagi |
| 7,651,887 | B2 | 1/2010 | Morita et al. |
| 8,598,282 | B2 | 12/2013 | Hamamoto et al. |
| 2011/0147955 | A1* | 6/2011 | Kashiwagi ............... C08L 83/04 257/791 |
| 2013/0053512 | A1 | 2/2013 | Kojima et al. |
| 2013/0161683 | A1* | 6/2013 | Hamamoto ............ C08G 77/12 257/100 |
| 2015/0158981 | A1* | 6/2015 | Kusunoki ............... C08L 83/04 528/31 |

FOREIGN PATENT DOCUMENTS

| | | |
|---|---|---|
| JP | H02-235933 A | 9/1990 |
| JP | H03-197486 A | 8/1991 |
| JP | 2006-508216 A | 3/2006 |
| JP | 2006-93354 A | 4/2006 |
| JP | 2007-2234 A | 1/2007 |
| JP | 2010-506982 A | 3/2010 |
| JP | 5505991 B2 | 5/2014 |
| JP | 5534977 B2 | 7/2014 |
| JP | 2015-14007 A | 1/2015 |
| WO | WO 2004/050744 A1 | 6/2004 |
| WO | WO 2008/046142 A1 | 4/2006 |
| WO | WO 2012/002560 A1 | 1/2012 |

OTHER PUBLICATIONS

Extended European Search Report dated Jan. 25, 2017, in European Patent Application No. 16179653.7.

* cited by examiner

*Primary Examiner* — Margaret G Moore
(74) *Attorney, Agent, or Firm* — Birch, Stewart, Kolasch & Birch, LLP

(57) ABSTRACT

An organopolysiloxane having at least 4 terminal hydrosilyl groups per molecule is novel. Also provided is an addition curable silicone composition comprising (A) a linear organopolysiloxane having at least two alkenyl groups per molecule, (B) an organopolysiloxane having at least 4 terminal hydrosilyl groups per molecule, and (C) a hydrosilylation catalyst.

14 Claims, 4 Drawing Sheets

HYDROSILYL-CONTAINING ORGANOPOLYSILOXANE, MAKING METHOD, ADDITION CURABLE SILICONE COMPOSITION, AND SEMICONDUCTOR PACKAGE

CROSS-REFERENCE TO RELATED APPLICATION

This non-provisional application claims priority under 35 U.S.C. § 119(a) on Patent Application Nos. 2015-151748 and 2015-151780 filed in Japan on Jul. 31, 2015 and Jul. 31, 2015, respectively, the entire contents of which are hereby incorporated by reference.

TECHNICAL FIELD

This invention relates to a hydrosilyl-containing organopolysiloxane and a method for preparing the same. More particularly, it relates to an organopolysiloxane containing a plurality of terminal hydrosiloxy groups (i.e., $HR_2SiO_{1/2}$ units wherein R is a monovalent hydrocarbon group) in the molecule, and a method for preparing the same. It also relates to an addition curable silicone composition, especially an addition curable silicone composition comprising an organopolysiloxane containing a plurality of terminal hydrosilyl groups, and a semiconductor package comprising a cured product of the composition.

BACKGROUND ART

Recently, great attention is paid to organopolysiloxanes because of their excellent properties including light transmission, heat resistance, gas permeability and chemical stability. Since organopolysiloxanes having any desired properties can be prepared by changing the type of monomers, charge monomer composition, and reaction conditions in their synthesis process, they have found practical use in a variety of fields.

Among others, an organopolysiloxane having a plurality of hydrosilyl groups (i.e., Si—H groups) in a common molecule is regarded essential as the crosslinker in addition curable organopolysiloxane resin compositions. A variety of multifunctional hydrosilyl-containing organopolysiloxanes have been developed. For example, Patent Document 1 discloses that a silicone resin is cured using an organopolysiloxane having two or four terminal hydrosiloxy groups ($HR_2SiO_{1/2}$ units) as the crosslinker. The cured resin is used as encapsulant over optical semiconductor devices. Patent Document 2 describes a cured product of an organopolysiloxane having a plurality of pendant hydrosiloxy groups ($HRSiO_{2/2}$ units).

Patent Document 3 discloses that an organopolysiloxane having a hydrosilyl group may be bonded with a compound having an unsaturated hydrocarbon group by hydrosilylation reaction. The resulting product is useful as a starting material to organically modified silicones such as epoxy- and acrylic-modified silicones.

These hydrosilyl-containing organopolysiloxanes are useful materials. As is well known in the art, the hydrosilyl groups are divided into three types: $HR_2SiO_{1/2}$, $HRSiO_{2/2}$, and $HSiO_{3/2}$. Among these, the organopolysiloxanes having $HR_2SiO_{1/2}$ (terminal hydrosiloxy group) are highly reactive in hydrosilylation. This leads to an advantage in productivity when they are used as crosslinker or starting material to modified silicones. Nowadays, the terminal hydrosilyl-containing organopolysiloxanes are advantageously used.

One general method for preparing a multifunctional hydrosilyl-containing organopolysiloxane involves contacting a chlorosilane and/or alkoxysilane with a stoichiometric amount of water in an organic solvent in the presence of an acid catalyst, to induce hydrolysis and condensation reaction. However, when $HR_2SiX$, $R_2SiX_2$, and $RSiX_3$ or $SiX_4$ (wherein X is a hydrolyzable group) are subjected to cohydrolytic condensation, the desired organopolysiloxane is not always obtained because random reactions take place. On cohydrolytic condensation of silanes wherein R and X are different, the desired organopolysiloxane is not obtained because reaction products are unbalanced due to differential reactivity.

For the synthesis of the desired organopolysiloxane, Patent Document 4 discloses the preparation of an organosilicone condensation product by condensation of a silanol-containing siloxane in the presence of a catalyst which is a sodium or potassium salt of boric acid or phosphoric acid. Patent Document 5 describes the preparation of an organopolysiloxane by reaction of a silanol-containing siloxane in the presence of a catalyst which is selected from among a hydroxide, chloride, and oxide of an alkali or alkaline earth metal, and a basic metal salt. Patent Document 6 describes that even magnesium or calcium hydroxide can catalyze condensation reaction of a silanol-containing siloxane and an alkoxysilane as long as a protic solvent is co-present. Patent Document 7 describes the preparation of an organosilicone condensate by reaction of a silicon compound having a silanol group and/or alkoxysilyl group in the presence of a catalyst selected from among strontium oxide, barium oxide, strontium hydroxide, barium hydroxide, and mixtures thereof.

With the methods of Patent Documents 4 to 7, organopolysiloxanes of controlled structure are obtainable by limiting reaction sites to silanol and alkoxy groups. Since the catalyst used is a solid catalyst, advantageously the catalyst can be readily removed from the organopolysiloxane product by filtration. These benefits are advantageous in the field where precise control of material is necessary or residual impurities are not permissible, for example, in the fields of optical, electronic, and medical materials.

As alluded to previously, organopolysiloxanes find practical use in a variety of fields by virtue of their useful properties. Among others, the organopolysiloxanes having a plurality of terminal hydrosilyl groups in the molecule are used in the fields where liquid silicone resins serving as semiconductor encapsulant or sealant must be crosslinked and cured. In these fields, since the physical properties (e.g., hardness and elongation) of a cured product must be tailored so as to comply with an ambient situation on use, a variety of hydrogenorganopolysiloxanes have been developed. The synthesis process is restricted in that the hydrosilyl group is susceptible to hydrolysis, i.e., dehydrogenation if a strong alkali or similar catalyst is present. For this reason or other, no satisfactory organopolysiloxane is available up to the present.

Meanwhile, addition curable silicone resin compositions have heretofore been used as the encapsulant for semiconductor devices such as LED, because of their good properties including heat resistance, light resistance and fast cure. For example, Patent Document 8 discloses an addition curable silicone resin composition exhibiting a high bonding force to LED packages of thermoplastic resins, typically PPA. Patent Document 9 discloses an addition curable silicone resin composition, with which optoelectronic chips are encapsulated by compression molding.

Although addition curable silicone resin compositions are commonly used as the semiconductor encapsulating material, their properties are still unsatisfactory. Particularly in the semiconductor encapsulant field, it is a common practice to encapsulate semiconductor devices by compression molding or transfer molding. From the aspect of productivity, there is a demand for a thermosetting silicone resin composition which is rapidly cured to a sufficient hardness for mold release. In prior art addition curable silicone resin compositions, an organohydrogenpolysiloxane having multifunctional SiH groups capable of 3D crosslinking in a common molecule is used as the crosslinker for enhancing the cure rate. However, such organohydrogenpolysiloxanes having a multiplicity of terminal SiH groups to provide an accelerated cure rate are difficult to synthesize while the type thereof is limited. Instead, an organohydrogenpolysiloxane having incorporated in its structure pendant SiH groups to provide a lower cure rate is often used as the crosslinker.

As pointed out above, Patent Documents 1 and 2 disclose organohydrogenpolysiloxanes. The organohydrogenpolysiloxane described in Patent Document 1 as having four terminal SiH groups provides an insufficient cure rate. The organohydrogenpolysiloxane described in Patent Document 2 as consisting of terminal SiH units and $SiO_{4/2}$ units has the problem that the cured resin product is brittle and susceptible to cracks.

CITATION LIST

Patent Document 1: JP 5505991 (U.S. Pat. No. 8,598,282)
Patent Document 2: JP 5534977 (WO 2012/002560)
Patent Document 3: JP-A 2015-014007
Patent Document 4: JP-A H02-235933
Patent Document 5: JP-A H03-197486
Patent Document 6: JP-A 2006-508216 (WO 2004/050744)
Patent Document 7: JP-A 2010-506982 (WO 2008/046142)
Patent Document 8: JP-A 2007-002234
Patent Document 9: JP-A 2006-093354

DISCLOSURE OF INVENTION

An object of the invention is to provide a novel hydrosilyl-containing organopolysiloxane containing a plurality of terminal hydrosilyl groups and a method for preparing the same. Another object is to provide an addition curable silicone composition, especially an addition curable silicone composition comprising an organohydrogenpolysiloxane containing in a common molecule a plurality of terminal hydrosilyl groups for accelerating the cure rate and $SiO_{2/2}$ units for solving the brittleness of the cured product; and a semiconductor package comprising a semiconductor chip encapsulated with a cured product of the composition and featuring high reliability.

The inventors have found that a hydrosilyl-containing organopolysiloxane containing a plurality of terminal hydrosilyl groups in a common molecule can be effectively synthesized by condensing an organosilicon compound having alkoxysilyl (—SiOR) groups with an organosilicon compound having silanol (—SiOH) groups in the presence of a specific basic catalyst, to synthesize an intermediate compound having some alkoxysilyl groups left therein, and endcapping the intermediate compound with an organosilicon compound having hydrosilyl groups in the presence of an acid catalyst; that an addition curable silicone composition comprising the organohydrogenpolysiloxane containing at least 4 terminal SiH groups exhibits an accelerated cure rate; and that a semiconductor package encapsulated with a cured product of the composition remains highly reliable.

In one aspect, the invention provides an organopolysiloxane having at least 4 terminal hydrosilyl groups per molecule, represented by the general formula (1).

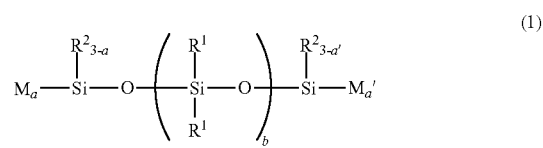

(1)

Herein $R^1$ is each independently a $C_1$-$C_6$ monovalent aliphatic hydrocarbon group or $C_6$-$C_{12}$ monovalent aromatic hydrocarbon group, $R^2$ is each independently hydrogen, a $C_1$-$C_6$ monovalent aliphatic hydrocarbon group or $C_6$-$C_{12}$ monovalent aromatic hydrocarbon group, M is each independently a group of the following formula:

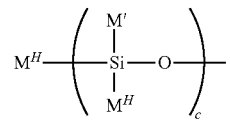

wherein $M^H$ is each independently a group of the following formula:

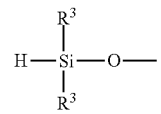

wherein $R^3$ is each independently a $C_1$-$C_6$ monovalent aliphatic hydrocarbon group or $C_6$-$C_{12}$ monovalent aromatic hydrocarbon group, M' is each independently a group represented by $R^2$ or $M^H$, c is an integer of 0 to 4, a and a' each are an integer of 0 to 3, with the proviso that a and a' are not equal to 0 at the same time, and b is an integer of 1 to 50.

Preferably in formula (1), 40 to 100 mol % of the total number of groups $R^1$ per molecule is a $C_6$-$C_{12}$ monovalent aromatic hydrocarbon group. More preferably, all groups $R^1$ per molecule are $C_6$-$C_{12}$ monovalent aromatic hydrocarbon groups.

Also preferably in formula (1), b is an integer of 1 to 25. More preferably, b is an integer of 1 to 5.

In a second aspect, the invention provides a method for preparing the hydrosilyl-containing organopolysiloxane having at least 4 terminal hydrosilyl groups per molecule, represented by formula (1), the method comprising the steps of:

effecting condensation reaction of an organosilicon compound having the general formula (2):

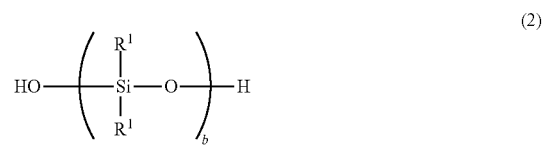

(2)

wherein R¹ and b are as defined above, with an organosilicon compound having the general formula (3):

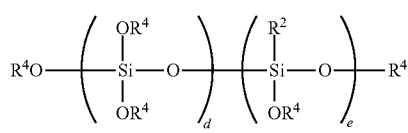
(3)

wherein R² is as defined above, R⁴ is each independently hydrogen, a $C_1$-$C_6$ monovalent aliphatic hydrocarbon group or $C_6$-$C_{12}$ monovalent aromatic hydrocarbon group, d and e each are an integer of 0 to 4, and $1 \leq d+e \leq 4$, in the presence of a basic catalyst, and endcapping the reaction product with an organosilicon compound having the general formula (4) and/or (5):

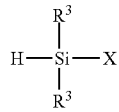
(4)

wherein R³ is as defined above and X is a hydrolyzable group or hydroxyl group,

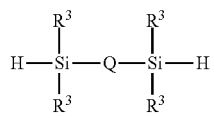
(5)

wherein R³ is as defined above and Q is oxygen or —NH—.

In a third aspect, the invention provides an addition curable silicone composition comprising the following components (A) to (C):

(A) a linear organopolysiloxane having at least two alkenyl groups per molecule, represented by the formula (11):

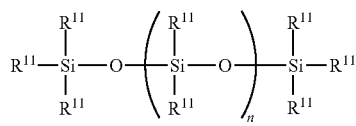
(11)

wherein R¹¹ is each independently a $C_1$-$C_{12}$ monovalent saturated is hydrocarbon group, $C_6$-$C_{12}$ monovalent aromatic hydrocarbon group, or $C_2$-$C_{10}$ alkenyl group, at least two of groups R¹¹ being alkenyl, and n is an integer of 0 to 1,000, (B) an organopolysiloxane having at least 4 terminal hydrosilyl groups per molecule, represented by the above formula (1), and (C) a catalytic amount of a hydrosilylation catalyst.

The silicone composition may further comprise (D) an organopolysiloxane of network structure having at least 2 alkenyl groups per molecule, represented by the formula (12):

$(R^{11}_3SiO_{1/2})_o(R^{11}_2SiO_{2/2})_p(R^{11}SiO_{3/2})_q(SiO_{4/2})_r$ (12)

wherein R¹¹ is as defined above, at least two of groups R¹¹ being alkenyl, o is an integer of 0 to 100, p is an integer of 0 to 300, q is an integer of 0 to 200, r is an integer of 0 to 200, $1 \leq q+r \leq 400$, $2 \leq o+p+q+r \leq 800$, o, p, q and r have such values that the organopolysiloxane has at least two alkenyl groups per molecule. Component (D) is present in such an amount of 5 to 900 parts by weight per 100 parts by weight of component (A) that a ratio of the total number of hydrosilyl groups in component (B) to the total number of alkenyl groups in components (A) and (D) is 0.4/1 to 4/1.

The silicone composition may further comprise (E) a linear organohydrogenpolysiloxane represented by the formula (13):

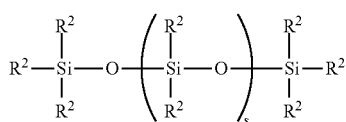
(13)

wherein R² is as defined above, at least two of groups R² being hydrogen, s is an integer of 0 to 100. Component (E) is present in such an amount that a ratio of the total number of hydrosilyl groups in components (B) and (E) to the total number of alkenyl groups in component (A) or components (A) and (D) is 0.4/1 to 4/1, and in an amount of 10 to 99% by weight based on the total weight of components (B) and (E).

With respect to component (B) or hydrosilyl-containing organopolysiloxane, preferred ranges of R¹ and b in formula (1) are the same as described above.

In a fourth aspect, the invention provides a semiconductor package comprising the addition curable silicone composition of the second aspect in the cured state.

ADVANTAGEOUS EFFECTS OF INVENTION

The hydrosilyl-containing organopolysiloxane containing a plurality of terminal hydrosilyl groups in a common molecule is efficient to synthesize, functions as a crosslinker when added to an addition curable silicone resin composition, is useful as a starting material toward modified silicones, and finds advantageous use in many industrial fields.

The addition curable silicone composition comprising the hydrosilyl-containing organopolysiloxane containing a plurality of terminal SiH groups in a common molecule as crosslinker is cured at an accelerated-cure rate, contributing to an improvement in productivity in the field using addition curable silicone compositions, typically semiconductor packaging field. Since the hydrosilyl-containing organopolysiloxane contains $SiO_{2/2}$ units within the molecule, which serve to endow the cured composition with toughness, a cured product featuring reliability is obtainable. When a semiconductor chip is encapsulated with the cured product of the addition curable silicone composition, a semiconductor package with reliability can be briefly fabricated.

DESCRIPTION OF ACCOMPANYING DRAWINGS

DESCRIPTION OF PREFERRED EMBODIMENTS

Figure 1:
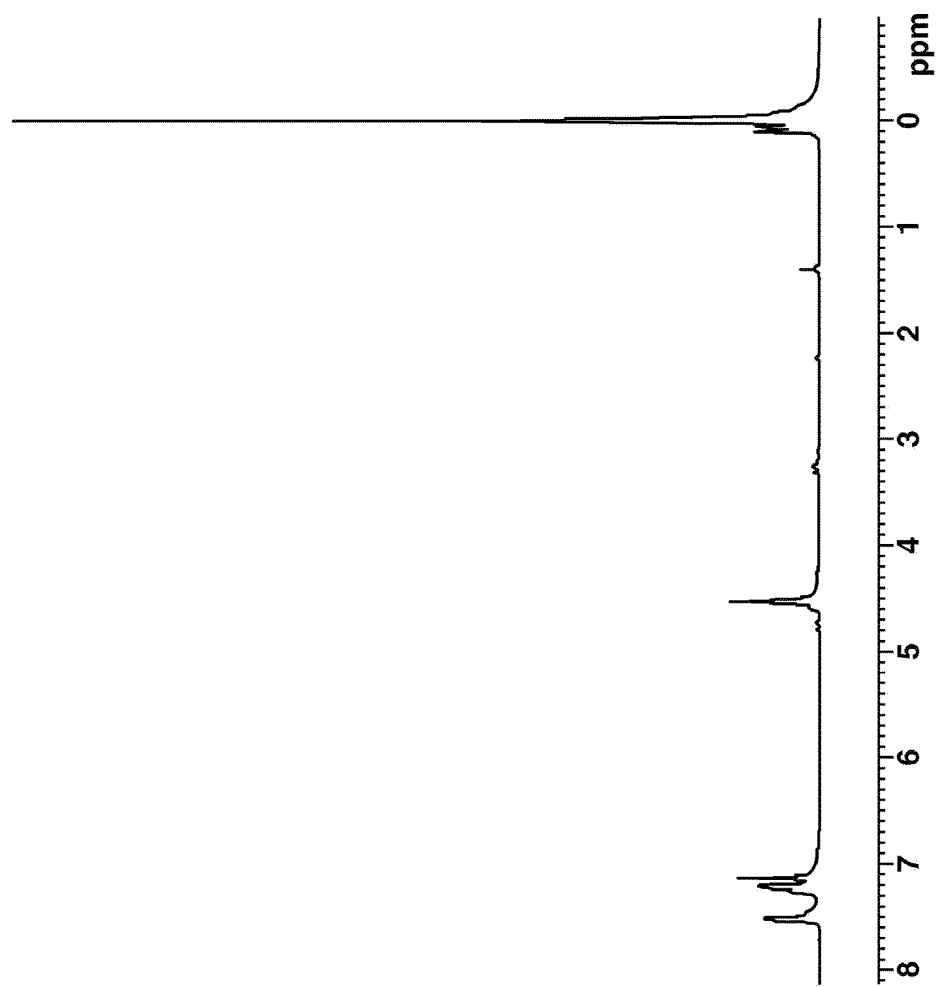
FIG. 1 is a diagram showing ¹H-NMR spectrum of a hydrosilyl-containing organopolysiloxane in Example 1.

The notation (Cn-Cm) means a group containing from n to m carbon atoms per group.

Hydrosilyl-Containing Organopolysiloxane

One embodiment of the invention is a hydrosilyl-containing organopolysiloxane having at least 4 terminal hydrosilyl groups per molecule, represented by the general formula (1).

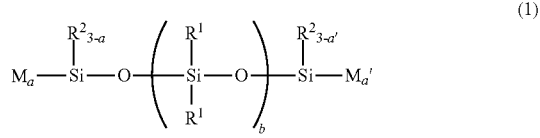

In formula (1), $R^1$ is each independently a $C_1$-$C_6$ monovalent aliphatic hydrocarbon group or $C_6$-$C_{12}$ monovalent aromatic hydrocarbon group. $R^2$ is each independently hydrogen, a $C_1$-$C_6$ monovalent aliphatic hydrocarbon group or $C_6$-$C_{12}$ monovalent aromatic hydrocarbon group. M is each independently a group of the following formula. The subscripts a and a' each are an integer of 0 to 3, with the proviso that a and a' are not equal to 0 at the same time, and b is an integer of 1 to 50.

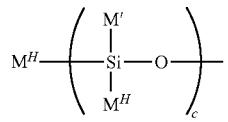

Herein $M^H$ is each independently a group of the following formula:

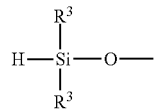

wherein $R^3$ is each independently a $C_1$-$C_6$ monovalent aliphatic hydrocarbon group or $C_6$-$C_{12}$ monovalent aromatic hydrocarbon group, M' is each independently a group represented by $R^2$ or $M^H$, and c is an integer of 0 to 4.

In formula (1), examples of group $R^1$ include $C_1$-$C_6$ monovalent linear aliphatic hydrocarbon groups such as methyl, ethyl, propyl, butyl and hexyl, $C_3$-$C_6$ monovalent cycloaliphatic hydrocarbon groups such as cyclohexyl, and $C_6$-$C_{12}$ monovalent aromatic hydrocarbon groups such as phenyl, benzyl and naphthyl. Inter alia, methyl and phenyl are preferred.

Examples of group $R^2$ include hydrogen, $C_1$-$C_6$ monovalent linear aliphatic hydrocarbon groups such as methyl, ethyl, propyl, butyl and hexyl, $C_3$-$C_6$ monovalent cycloaliphatic hydrocarbon groups such as cyclohexyl, and $C_6$-$C_{12}$ monovalent aromatic hydrocarbon groups such as phenyl, benzyl and naphthyl. Inter alia, hydrogen, methyl and phenyl are preferred.

Examples of group M' include hydrogen, $C_1$-$C_6$ monovalent linear aliphatic hydrocarbon groups such as methyl, ethyl, propyl, butyl and hexyl, $C_3$-$C_6$ monovalent cycloaliphatic hydrocarbon groups such as cyclohexyl, $C_6$-$C_{12}$ monovalent aromatic hydrocarbon groups such as phenyl, benzyl and naphthyl, and diorganosiloxy groups such as dimethylsiloxy and diethylsiloxy. Inter alia, hydrogen, methyl and phenyl are preferred.

Examples of group $R^3$ include $C_1$-$C_6$ monovalent linear aliphatic hydrocarbon groups such as methyl, ethyl, propyl, butyl and hexyl, $C_3$-$C_6$ monovalent cycloaliphatic hydrocarbon groups such as cyclohexyl, and $C_6$-$C_{12}$ monovalent aromatic hydrocarbon groups such as phenyl, benzyl and naphthyl. Inter alia, methyl and phenyl are preferred.

The subscripts a and a' each are an integer of 0 to 3, preferably 2 or 3, with the proviso that a and a' are not equal to 0 at the same time, and b is an integer of 1 to 50, preferably 1 to 25, more preferably 1 to 10, and even more preferably 1 to 5. As long as b is in the range, the cross-linking density reaches an acceptable level, and a satisfactory cured product is obtainable. The subscript c is an integer of 0 to 4, preferably 0 to 3. It is noted that the hydrosilyl-containing organopolysiloxane of formula (1) has at least 4, preferably 4 to 18 terminal hydrosilyl groups per molecule.

Typically a silicone resin composition is cured using the hydrosilyl-containing organopolysiloxane as a crosslinker. A cured product having satisfactory mechanical properties is obtainable when a $C_6$-$C_{12}$ monovalent aromatic hydrocarbon group accounts for 5 to 100 mol %, preferably 40 to 100 mol %, more preferably 60 to 100 mol %, and most preferably all (100 mol %) of the total number of groups $R^1$ per molecule.

Examples of the hydrosilyl-containing organopolysiloxane of formula (1) are shown below.

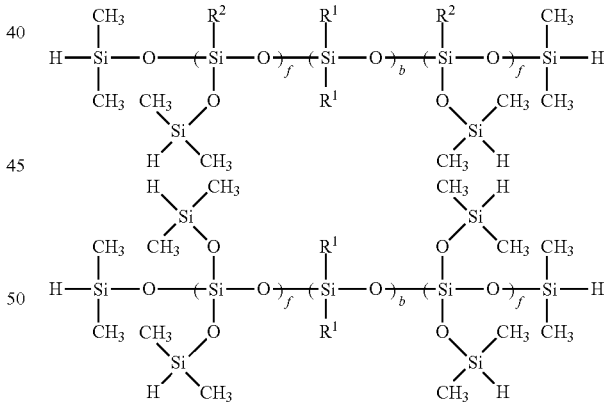

Herein $R^1$, $R^2$, and b are as defined above, and f is independently an integer of 1 to 5.

Preparation Method

Described below is the method for preparing the hydrosilyl-containing organopolysiloxane. According to the inventive method, the hydrosilyl-containing organopolysiloxane, that is, organopolysiloxane having at least 4 terminal hydrosilyl groups per molecule, represented by the general formula (1), can be readily synthesized by the steps of effecting condensation reaction of an organosilicon compound having the general formula (2):

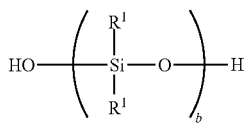

wherein $R^1$ and b are as defined above, with an organosilicon compound having the general formula (3):

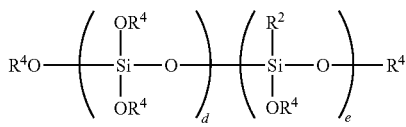

wherein $R^2$ is as defined above, $R^4$ is each independently hydrogen, a $C_1$-$C_6$ monovalent aliphatic hydrocarbon group or $C_6$-$C_{12}$ monovalent aromatic hydrocarbon group, d and e each are an integer of 0 to 4, and $1 \leq d+e \leq 4$, in the presence of a basic catalyst, and endcapping the reaction product with an organosilicon compound having the general formula (4) and/or (5):

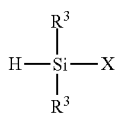

wherein $R^3$ is as defined above and X is a hydrolyzable group or hydroxyl group,

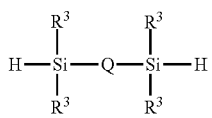

wherein $R^3$ is as defined above and Q is oxygen or —NH—.

The first step is condensation reaction of an organosilicon compound having formula (2) with an organosilicon compound having formula (3) in the presence of a basic catalyst.

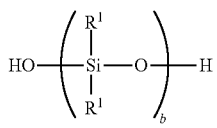

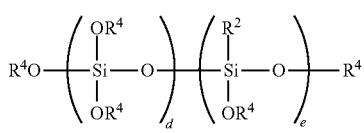

In formula (2), $R^1$ and b are as defined above. Examples of the organosilicon compound having formula (2) include α,ω-dihydroxydimethylpolysiloxanes such as 1,1,3,3-tetramethyldisiloxane-1,3-diol and 1,1,3,3,5,5-hexamethyltrisiloxane-1,5-diol; α,ω-dihydroxymethylphenylpolysiloxanes such as methylphenylsilane diol and 1,3,5-trimethyl-1,3,5-triphenyltrisiloxane-1,5-diol; α,ω-dihydroxydiphenylpolysiloxanes such as diphenylsilane diol and 1,1,3,3-tetraphenyldisiloxane-1,3-diol; and α,ω-dihydroxydimethyldiphenylpolysiloxanes such as 1,3-dimethyl-1,3-diphenyldisiloxane-1,3-diol and 3,3-dimethyl-1,1,5,5-tetraphenyltrisiloxane-1,5-diol. Inter alia, diphenylsilane diol is preferred.

In formula (3), $R^2$ is as defined above. $R^4$ is each independently hydrogen, a $C_1$-$C_6$ monovalent aliphatic hydrocarbon group or $C_6$-$C_{12}$ monovalent aromatic hydrocarbon group, examples of which are as exemplified above for $R^2$, with methyl, ethyl and hydrogen being preferred. The subscripts d and e each are an integer of 0 to 4, and $1 \leq d+e \leq 4$. A combination of d=1 and e=0, or d=0 and e=1 is preferred.

Examples of the organosilicon compound having formula (3) include trimethoxysilane, triethoxysilane, methyltrimethoxysilane, methyltriethoxysilane, ethyltrimethoxysilane, phenyltrimethoxysilane, tetramethoxysilane, tetraethoxysilane, and oligomers thereof. Inter alia, trimethoxysilane, triethoxysilane, methyltrimethoxysilane, and tetramethoxysilane are preferred as well as monomers to tetramers thereof.

In the condensation reaction of a compound of formula (2) with a compound of formula (3), they are preferably combined such that the compound of formula (3) is in excess of the compound of formula (2), specifically in an amount of at least 2 moles, more preferably at least 3 moles per mole of the compound of formula (2). Such an excess of the compound of formula (3) added is effective for preventing the intermediate compound from building up its molecular weight. The upper limit of the amount of compound of formula (3) added is typically equal to or less than 10 moles. The excess portion of the compound of formula (3) that has not been involved in the reaction may be separated and removed by any well-known purifying techniques such as atmospheric distillation, vacuum distillation, extraction, and column chromatography. Of these purifying techniques, purification by atmospheric distillation or vacuum distillation is desirable from the aspects of yield and purity. From the same standpoint, the compound of formula (3) should preferably have such a low molecular weight that it may be separated and removed by vacuum distillation.

The catalyst used in the condensation reaction may be at least one basic catalyst selected from among amine and ammonium catalysts and metal compound catalysts. Suitable amine and ammonium catalysts include ammonia, triethylamine, tetramethylammonium hydroxide, n-butylamine, and benzylamine, with n-butylamine and benzylamine being preferred.

Suitable metal compound catalysts include hydroxides of Group 2 elements, hydrated hydroxides of Group 2 elements, oxides of Group 2 elements, and hydroxides and oxides of Group 3 to 15 elements in the Periodic Table. Examples of the metal compound catalysts include radium hydroxide, barium hydroxide, strontium hydroxide, calcium hydroxide, magnesium hydroxide, beryllium hydroxide, lanthanum(III) hydroxide, cerium(IV) hydroxide, zirconium (IV) hydroxide, iron(II) hydroxide, iron(III) hydroxide, cobalt(II) hydroxide, nickel(II) hydroxide, copper(II) hydroxide, gold(III) hydroxide, zinc(II) hydroxide, cadmium(II) hydroxide, aluminum(III) hydroxide, indium(III) hydroxide, thallium(I) hydroxide, lead(II) hydroxide, bismuth(III) hydroxide, barium oxide, strontium oxide, calcium oxide, magnesium oxide, beryllium oxide, manganese(IV) oxide, iron(II) oxide, and copper(II) oxide. From the standpoint of availability or the like, hydroxides of Group 2 elements, and hydroxides of Group 3 to 15 elements are preferred. Inter alia, barium hydroxide, calcium hydroxide, magnesium hydroxide, strontium hydroxide, lanthanum(III) hydroxide, aluminum(III) hydroxide, iron(II) hydroxide, iron(III) hydroxide, and copper(II) hydroxide are preferred. Also, hydrated hydroxides of Group 2 elements such as barium hydroxide octahydrate, barium hydroxide monohydrate, and strontium hydroxide octahydrate are preferred.

For the purpose of enhancing reactivity, the metal compound catalyst may be previously surface treated with a silane coupling agent. Any of prior art well-known silane coupling agents may be used. Preferred from the standpoint of catalyst dispersion are those silane coupling agents having a similar structure to the organosilicon compounds subject to condensation reaction, especially an organosilicon compound having an alkoxy group. Examples of the silane coupling agent include trimethoxysilane, triethoxysilane, methyltrimethoxysilane, decyltrimethoxysilane, vinyltrimethoxysilane, phenyltrimethoxysilane, styryltrimethoxysilane, 3,3,3-trifluoropropyltrimethoxysilane, 3-glycidyloxypropyldimethoxymethylsilane, 3-glycidyloxypropyltrimethoxysilane, 3-methacryloxypropyltrimethoxysilane, 3-aminopropyltrimethoxysilane, 3-mercaptopropyltrimethoxysilane, 3-chloropropyltrimethoxysilane, 1,1,3,3,5,5-hexamethoxy-1,3,5-trimethyltrisiloxane, 1,1,5,5-tetramethoxy-1,3,5-trimethyltrisiloxan-3-ol, dimethyldimethoxysilane, dimethyldiethoxysilane, phenylmethyldimethoxysilane, diphenyldimethoxysilane, distyryldimethoxysilane, dipentafluorophenyldimethoxysilane, and hexamethyldisilazane. Inter alia, trimethoxysilane, vinyltrimethoxysilane, methyltrimethoxysilane, and 3-glycidyloxypropyltrimethoxysilane are preferred.

The metal compound catalyst may be surface treated with a silane coupling agent by any prior art well-known methods. For example, wet and dry methods are applicable. Although the metal compound catalyst and the silane coupling agent may be mixed in any desired ratio, it is preferable for avoiding any loss of catalyst activity to use 0.001 to 10 parts, more preferably 0.01 to 5 parts by weight of the silane coupling agent per 100 parts by weight of the metal compound catalyst.

The amount of the catalyst used is not particularly limited as long as condensation reaction takes place to an acceptable extent. For example, the basic catalyst selected from amine and ammonium catalysts is used in an amount of preferably 0.01 to 10% by weight, more preferably 0.5 to 5% by weight based on the total weight of the organosilicon compounds and catalyst. When the metal compound is used as the catalyst, it is used in an amount of preferably 0.01 to 20%, more preferably 0.1 to 10%, even more preferably 0.2 to 9% by weight, and further preferably 0.5 to 5% by weight based on the total weight of the organosilicon compounds and catalyst. As long as the amount of the catalyst is in the range, it exerts a satisfactory catalytic effect to the condensation reaction.

The condensation reaction may be effected in a solvent. The solvent is used as a regulator for regulating the rate and conversion of condensation reaction or as a diluent for the resulting condensate. The solvent may be at least one member selected from nonpolar solvents and polar solvents. Suitable nonpolar solvents include hydrocarbons such as n-hexane, n-heptane and isooctane, and aromatic hydrocarbons such as toluene and xylene. Suitable polar solvents include water; alcohols such as methanol, ethanol, and isopropanol; alcohol esters; ketones such as acetone, methyl ethyl ketone and cyclohexanone; ethers such as diethyl ether and dibutyl ether; esters such as ethyl acetate, isopropyl acetate, and butyl acetate; cyanated hydrocarbons such as acetonitrile; amines; amides such as acetamide; halogenated hydrocarbons such as methylene chloride, chloroform, and hexafluoro-m-xylene; and sulfur-containing compounds such as dimethyl sulfoxide.

The amount of the solvent used is not particularly limited and may be adjusted as appropriate. Typically, the solvent is used in such amounts that the resulting solution may contain the organosilicon compounds subject to condensation reaction in a concentration of 5 to 97%, more preferably 20 to 80% by weight. Notably, the condensation reaction may also be effected in a solventless system.

In the condensation reaction system, any additional components may be used as long as they do not retard the progress of condensation reaction. For example, a neutral surfactant may be added for the purpose of enhancing the dispersion of the solid catalyst. When the compound of formula (2) or (3) has a reactive group, a reaction inhibitor may be added. Each of these additional components may be used alone or in admixture. The amount of the additional component used may be adjusted as appropriate as long as the benefits of the invention are not compromised.

In effecting condensation reaction, the system may be either cooled or heated. The reaction temperature is preferably in a range of −30° C. to 150° C., more preferably −10° C. to 100° C., and even more preferably 0° C. to 80° C. The reaction time is typically 2 to 48 hours, preferably 6 to 24 hours.

Preferably, the method further includes the step of removing the catalyst after the completion of condensation reaction. If the compound of formula (4) or (5) is subsequently added to the system with the catalyst remaining, there is the risk of dehydrogenation reaction taking place. The catalyst may be removed, for example, by neutralization, filtration, vacuum distillation or solvent extraction. It is possible, but undesirable to remove the catalyst by water washing because the reaction product (intermediate) undergoes hydrolysis, failing to produce the desired compound. In the practice of the invention, the catalyst may be readily removed from the reaction product by filtration when it is a metal compound catalyst, or by neutralization when it is a basic catalyst. After filtration, any of the aforementioned solvents may be added for the purpose of adjusting the viscosity of the reaction product.

Also preferably, the method may further include the step of purifying the reaction product by any well-known techniques such as vacuum stripping, active carbon treatment, and chromatography for the purpose of separating and removing the excess of the compound of formula (3) which has not consumed by reaction, by-products, solvent and impurities from the reaction product.

This is followed by the step of endcapping the intermediate (i.e., product of condensation reaction between the compounds having formulae (2) and (3)) with an organosilicon compound having the general formula (4) and/or (5).

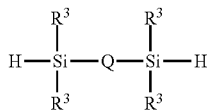

(5)

In formula (4), $R^3$ is as defined above and X is a hydrolyzable group or hydroxyl group. Examples of the hydrolyzable group X include $C_1$-$C_{10}$ alkoxy groups such as methoxy, ethoxy, propoxy and butoxy, $C_2$-$C_{10}$ alkoxyalkoxy groups such as methoxymethoxy and methoxyethoxy, $C_1$-$C_{10}$ acyloxy groups such as acetoxy, $C_2$-$C_{10}$ alkenyloxy groups such as isopropenoxy, and halogen atoms such as chlorine, bromine and iodine. Preferably X is hydroxyl, chlorine, methoxy or ethoxy.

Examples of the organosilicon compound having formula (4) include dimethylchlorosilane, dimethylmethoxysilane, dimethylethoxysilane, dimethylsilanol, methylphenylchlorosilane, methylphenylmethoxysilane, methylphenylethoxysilane, methylphenylsilanol, diphenylchlorosilane, diphenylmethoxysilane, diphenylethoxysilane, and diphenylsilanol. Inter alia, dimethylchlorosilane is preferred for availability.

In formula (5), $R^3$ is as defined above and Q is oxygen or —NH—.

Examples of the organosilicon compound having formula (5) include disiloxanes such as 1,1,3,3-tetramethyldisiloxane, 1,3-diphenyl-1,3-dimethyldisiloxane and 1,1,3,3-tetraphenyldisiloxane; and silazanes such as 1,1,3,3-tetramethyldisilazane, 1,3-diphenyl-1,3-dimethyldisilazane, and 1,1,3,3-tetraphenyldisilazane. Inter alia, 1,1,3,3-tetramethyldisiloxane is preferred for availability.

In the reaction of endcapping the intermediate resulting from condensation reaction between the compounds having formulae (2) and (3), the amount of the compound having formula (4) and/or (5) used is preferably such that at least equimolar amount of endcapping groups in the compound of formula (4) and/or (5) may be available per mole of alkoxy and/or hydroxyl groups in the intermediate. Specifically, the amount of the compound having formula (4) used is preferably 1 to 4 moles, more preferably 1.1 to 2 moles per mole of alkoxy and/or hydroxyl groups in the intermediate. The amount of the compound having formula (5) used is preferably 0.5 to 2 moles, more preferably 0.55 to 1 mole per mole of alkoxy and/or hydroxyl groups in the intermediate.

For the purpose of promoting the endcapping reaction more efficiently, water may be added to the reaction system in the presence of an acid catalyst. The amount of water added is preferably equal to or in excess of the molar amount of alkoxy and/or hydroxyl groups in the intermediate resulting from condensation reaction between the compounds having formulae (2) and (3). Specifically, water is added an amount of preferably 1 to 10 times, more preferably 1 to 5 times, and even more preferably 1 to 2 times greater than the molar amount of alkoxy and/or hydroxyl groups in the intermediate.

Suitable acid catalysts include sulfuric acid, hydrochloric acid and acetic acid, with sulfuric acid and hydrochloric acid being preferred. The amount of the catalyst used is not particularly limited as long as the endcapping reaction takes place to a full extent. The acid catalyst is preferably added in an amount of 0.01 to 20% by weight, more preferably 0.5 to 10% by weight based on the total weight of water and catalyst. As long as the amount of the catalyst is in the range, it exerts a satisfactory catalytic effect to the endcapping reaction.

In the endcapping reaction, a solvent and additives may be used as in the condensation reaction.

In effecting endcapping reaction, the system may be either cooled or heated. The reaction temperature is preferably in a range of −30° C. to 150° C., more preferably −10° C. to 100° C., and even more preferably 0° C. to 60° C. The reaction time is typically 4 to 48 hours, preferably 6 to 24 hours.

After the completion of endcapping reaction, the method may further include the step of purifying the reaction product by any well-known techniques such as water washing, vacuum stripping, active carbon treatment, and chromatography for the purpose of separating and removing by-products, solvent and impurities from the reaction product.

According to the method of the invention, the desired hydrosilyl-containing organopolysiloxane can be effectively prepared.

Silicone Composition

A further embodiment of the invention is an addition curable silicone composition comprising the hydrosilyl-containing organopolysiloxane having formula (1). Specifically, the silicone composition is defined as comprising (A) an alkenyl-containing linear organopolysiloxane, (B) the hydrosilyl-containing organopolysiloxane having formula (1), and (C) a hydrosilylation catalyst.

(A) Linear Organopolysiloxane

Component (A) is a linear organo(poly)siloxane having at least two alkenyl groups per molecule, represented by the formula (11).

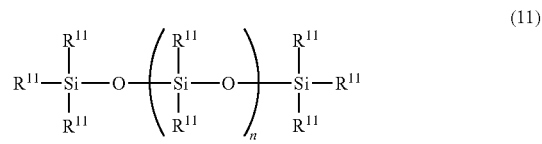

(11)

Herein $R^{11}$ is each independently a $C_1$-$C_{12}$ monovalent saturated hydrocarbon group, $C_6$-$C_{12}$ monovalent aromatic hydrocarbon group, or $C_2$-$C_{10}$ alkenyl group, at least two of groups $R^{11}$ being alkenyl, and n is an integer of 0 to 1,000, preferably 2 to 500, and more preferably 5 to 300.

In formula (11), examples of group $R^{11}$ include $C_1$-$C_6$ monovalent linear saturated (aliphatic) hydrocarbon groups such as methyl, ethyl, propyl, butyl and hexyl, $C_3$-$C_6$ monovalent cyclic saturated (aliphatic) hydrocarbon groups such as cyclohexyl, $C_6$-$C_{12}$ monovalent aromatic hydrocarbon groups such as phenyl, benzyl and naphthyl, and $C_2$-$C_{10}$ alkenyl groups such as vinyl, allyl, propenyl, hexenyl and styryl. Of the monovalent saturated hydrocarbon groups, methyl and cyclohexyl are preferred, with methyl being most preferred. Of the monovalent aromatic hydrocarbon groups, phenyl is preferred. Of the alkenyl groups, vinyl and allyl are preferred, with vinyl being most preferred. At least two of groups $R^{11}$ should be alkenyl. It is preferred that groups which are not alkenyl be methyl or phenyl.

The organopolysiloxane as component (A) should contain at least two alkenyl groups per molecule. An appropriate amount of alkenyl is 1.5 to 0.0001 mol/100 g, more preferably 0.15 to 0.0005 mol/100 g of the organopolysiloxane. The alkenyl groups may be attached at ends of the molecular chain or on side chains (i.e., intermediate positions of the molecular chain) or both, while it is preferred that at least two alkenyl groups be at ends of the molecular chain.

The organopolysiloxane may be one prepared by any well-known methods, or a commercially available product.

For instance, the organopolysiloxane may be prepared by co-condensation of an organosilicon compound having an alkenyl group such as vinyl or allyl (typically, silane, siloxane or silazane) with another silane or siloxane. The co-condensation may be performed according to the standard method.

Examples of suitable alkenyl-containing silanes include dimethylvinylchlorosilane, methylvinyldichlorosilane, trivinylchlorosilane, vinylmethylphenylchlorosilane, and alkoxy and silanol forms thereof. Examples of suitable alkenyl-containing siloxanes include dimers, oligomers and polymers including the foregoing alkenyl-containing silane units. Examples of suitable alkenyl-containing silazanes include divinyltetramethyldisilazane and divinyldimethyldiphenyldisilazane.

Although the other silane and siloxane to be co-condensed with the alkenyl-containing organosilicon compound are not particularly limited, those silanes having a monovalent hydrocarbon group and containing halogen, oxygen, nitrogen or sulfur atom are preferably used. Suitable silanes include trimethylchlorosilane, dimethyldichlorosilane, triphenylchlorosilane, diphenylmethylchlorosilane, phenyldimethylchlorosilane, phenylmethyldichlorosilane, diphenyldichlorosilane, triethylchlorosilane, diethyldichlorosilane, cyclohexylmethyldichlorosilane, and alkoxy and silanol forms thereof, trifluoropropylmethyldimethoxysilane, β-cyanoethylmethyldimethoxysilane, 3-methacryloxypropylmethyldimethoxysilane, 3-glycidyloxypropylmethyldimethoxysilane, 3-mercaptopropylmethyldimethoxysilane, and 3-aminopropylmethyldimethoxysilane. Also oligomers and polymers of the foregoing may be used as the siloxane.

In the preferred embodiment, component (A) is an organopolysiloxane of formula (11) wherein at least one group $R^{11}$ is a monovalent aromatic hydrocarbon group. Specifically, the silicon-bonded monovalent aromatic hydrocarbon groups preferably account for at least 3%, more preferably at least 5% of the total number of silicon-bonded substituent groups, and up to 80% of the total number of silicon-bonded substituent groups. As long as the monovalent aromatic hydrocarbon groups are included in the range, the organopolysiloxane as component (A) has a high refractive index and low gas permeability and is fully compatible with component (B). This ensures that the addition curable silicone composition cures into a cured product having good transparency and is best suited for the encapsulation of semiconductor chips.

(B) Hydrosilyl-Containing Organopolysiloxane

Component (B) is the hydrosilyl-containing organopolysiloxane having at least 4 terminal hydrosilyl groups per molecule, represented by the above formula (1). Component (B) functions as a crosslinker in the addition curable silicone composition. Since the hydrosilyl-containing organopolysiloxane of formula (1) has been defined and exemplified above, its description is omitted herein.

Component (B) is added in such an amount that a ratio of the number of hydrosilyl groups in component (B) to the total number of alkenyl groups in component (A) may be in a range from 0.4/1 to 4/1, preferably 0.6/1 to 3/1, and more preferably 0.8/1 to 2/1. If the hydrosilyl/alkenyl ratio is below the lower limit, the composition may be under-cured due to shortage of SiH groups. If the hydrosilyl/alkenyl ratio exceeds the upper limit, residual SiH groups tend to induce side reactions, typically dehydrogenation.

In an embodiment wherein the addition curable silicone composition further includes component (D) to be described below, the ratio of the number of hydrosilyl groups in component (B) to the total number of alkenyl groups in components (A) and (D) preferably falls in the above range.

In an embodiment wherein the addition curable silicone composition further includes component (E) to be described below, the ratio of the number of hydrosilyl groups in components (B) and (E) to the total number of alkenyl groups in component (A) or components (A) and (D) preferably falls in the above range. In this embodiment, the amount of component (B) is preferably 1 to 90%, more preferably 2 to 50%, and even more preferably 3 to 20% by weight based on the total weight of components (B) and (E).

(C) Hydrosilylation Catalyst

Component (C) is a hydrosilylation catalyst. The catalyst is not particularly limited and may be selected from well-known ones. Preferred are platinum group metal elements and platinum group metal compounds. Suitable catalysts include platinum base catalysts such as platinum (inclusive of platinum black), platinum chloride, chloroplatinic acid, platinum-olefin complexes such as platinum-divinylsiloxane complex, and platinum-carbonyl complexes, palladium base catalysts and rhodium base catalysts. These catalysts may be used alone or in admixture. Inter alia, chloroplatinic acid and platinum-olefin complexes such as platinum-divinylsiloxane complex are preferred.

The amount of component (C) used is not particularly limited and may be a catalytic amount. The catalytic amount is a sufficient amount for addition reaction to take place and may be determined as appropriate in accordance with the desired cure rate. In an example where the platinum group metal compound is used, it is preferred from the standpoint of reaction rate that the catalyst be used in such an amount as to provide $1.0 \times 10^{-5}$ to 1.0 part by weight, more preferably $1.0 \times 10^{-4}$ to $1.0 \times 10^{-2}$ part by weight of platinum group metal per 100 parts by weight of components (A) and (B) combined. In the embodiment wherein component (D) and/or (E) is included, the catalyst amount is preferably in the above range per 100 parts by weight of all components, i.e., (A)+(B)+(D)+(E).

(D) Organopolysiloxane of Network Structure

Optionally the silicone composition may further include (D) an organopolysiloxane of network structure having at least two alkenyl groups per molecule, represented by the formula (12).

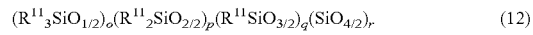

$$(R^{11}{}_3SiO_{1/2})_o(R^{11}{}_2SiO_{2/2})_p(R^{11}SiO_{3/2})_q(SiO_{4/2})_r \quad (12)$$

Herein $R^{11}$ is as defined above, at least two of groups $R^{11}$ being alkenyl, o is an integer of 0 to 100, p is an integer of 0 to 300, q is an integer of 0 to 200, r is an integer of 0 to 200, $1 \leq q+r \leq 400$, $2 \leq o+p+q+r \leq 800$, o, p, q and r have such values that the organopolysiloxane has at least two alkenyl groups per molecule.

In formula (12), $R^{11}$ is as defined above, preferably methyl, vinyl or allyl, with vinyl being most preferred. At least two of groups $R^{11}$ should be alkenyl. It is preferred that groups $R^{11}$ which are not alkenyl be methyl or phenyl.

The subscript o is an integer of 0 to 100, preferably 1 to 75, and more preferably 2 to 50; p is an integer of 0 to 300, preferably 0 to 200, and more preferably 1 to 100; q is an integer of 0 to 200, preferably 1 to 100, and more preferably 1 to 50; r is an integer of 0 to 200, preferably 1 to 100, and more preferably 1 to 50. They meet the range: $1 \leq q+r \leq 400$, preferably 1≤q+r≤200, and more preferably 1≤q+r≤100; and 2≤o+p+q+r≤800, preferably 2≤o+p+q+r≤400, and more preferably 2≤o+p+q+r≤200.

The organopolysiloxane as component (D) should contain at least two alkenyl groups per molecule. An appropriate amount of alkenyl is 0.5 to 0.001 mol/100 g, more preferably 0.25 to 0.01 mol/100 g of the organopolysiloxane. The alkenyl group may be attached to $R^{11}_3SiO_{1/2}$ unit, $R^{11}_2SiO_{2/2}$ unit, or $R^{11}SiO_{3/2}$ unit, or two or more thereof, preferably to $R^{11}_3SiO_{1/2}$ unit.

The organopolysiloxane may be one prepared by any well-known methods or a commercially available product.

For instance, the organopolysiloxane may be prepared by co-condensation of an organosilicon compound having an alkenyl group such as vinyl or allyl (typically, silane, siloxane or silazane) with another silane or siloxane. The co-condensation may be performed according to the standard method.

Examples of suitable alkenyl-containing silanes include dimethylvinylchlorosilane, methylvinyldichlorosilane, vinyltrichlorosilane, trivinylchlorosilane, vinylmethylphenylchlorosilane, and alkoxy and silanol forms thereof. Examples of suitable alkenyl-containing siloxanes include dimers, oligomers and polymers including the foregoing alkenyl-containing silane units. Examples of suitable alkenyl-containing silazanes include divinyltetramethyldisilazane and divinyldimethyldiphenyldisilazane.

Although the other silane and siloxane to be co-condensed with the alkenyl-containing organosilicon compound are not particularly limited, those silanes having a monovalent hydrocarbon group and containing halogen, oxygen, nitrogen or sulfur atom are preferably used. Suitable silanes include trimethylchlorosilane, dimethyldichlorosilane, methyltrichlorosilane, triphenylchlorosilane, diphenylmethylchlorosilane, phenyldimethylchlorosilane, phenylmethyldichlorosilane, diphenyldichlorosilane, phenyltrichlorosilane, tetrachlorosilane, triethylchlorosilane, diethyldichlorosilane, ethyltrichlorosilane, cyclohexylmethyldichlorosilane, cyclohexyltrichlorosilane, and alkoxy and silanol forms thereof, trifluoropropyltrimethoxysilane, β-cyanoethyltrimethoxysilane, 3-methacryloxypropyltrimethoxysilane, 3-glycidyloxypropyltrimethoxysilane, 3-mercaptopropyltrimethoxysilane, and 3-aminopropyltrimethoxysilane. Also oligomers and polymers of the foregoing may be used as the siloxane.

In the preferred embodiment, component (D) is an organopolysiloxane of formula (12) wherein at least one group $R^{11}$ is a monovalent aromatic hydrocarbon group. Specifically, the silicon-bonded monovalent aromatic hydrocarbon groups preferably account for at least 3%, more preferably at least 5% of the total number of silicon-bonded substituent groups, and up to 80% of the total number of silicon-bonded substituent groups. As long as the monovalent aromatic hydrocarbon groups are included in the range, the organopolysiloxane as component (D) has a high refractive index and low gas permeability and is fully compatible with component (B). This ensures that the addition curable silicone composition cures into a cured product having good transparency and is best suited for the encapsulation of semiconductor chips.

Component (D) is preferably present in an amount of 5 to 900 parts, more preferably 10 to 400 parts, and even more preferably 20 to 200 parts by weight per 100 parts by weight of component (A). Outside the range, a less amount of component (D) may fail to provide a hard cured product whereas a larger amount may provide a composition with too high a viscosity to work. Also the ratio of the total number of hydrosilyl groups in component (B) to the total number of alkenyl groups in components (A) and (D) is preferably in a range from 0.4/1 to 4/1, more preferably 0.6/1 to 3/1, and even more preferably 0.8/1 to 2/1.

(E) Linear Organohydrogenpolysiloxane

In addition to component (B), the silicone composition may optionally include (E) a linear organohydrogen(poly)siloxane represented by the formula (13).

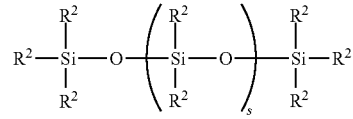

(13)

In formula (13), $R^2$ is as defined above, preferably hydrogen, methyl or phenyl. At least two of groups $R^2$ should be hydrogen. The subscript s is an integer of 0 to 100, preferably 1 to 75, and more preferably 1 to 50.

The organohydrogenpolysiloxane as component (E) should contain at least two silicon-bonded hydrogen atoms (i.e., SiH groups) per molecule. An appropriate amount of SiH is 1.7 to 0.01 mol/100 g, more preferably 1.6 to 0.05 mol/100 g of the organohydrogenpolysiloxane. The SiH groups may be attached at ends of the molecular chain or on side chains (i.e., intermediate positions of the molecular chain) or both.

The organohydrogenpolysiloxane may be one prepared by any well-known methods or a commercially available product.

Component (E) is preferably present in such an amount that a ratio of the total number of hydrosilyl groups in components (B) and (E) to the total number of alkenyl groups in component (A) or components (A) and (D) may be in a range from 0.4/1 to 4/1, more preferably 0.6/1 to 3/1, and even more preferably 0.8/1 to 2/1.

Also component (E) is used in an amount of preferably 10 to 99%, more preferably 50 to 98%, and even more preferably 80 to 97% by weight based on the total weight of components (B) and (E). Within this range, component (B) exerts the effect of accelerating the cure rate and a cured product having crack resistance is obtainable.

In addition to the above components (A) to (E), the addition curable silicone composition may include optional additives such as phosphor, inorganic filler, adhesive aid, and cure inhibitor. These additives are described below.

Phosphor

The phosphor used herein is not particularly limited and any well-known phosphors may be used. One preferred example is the phosphor capable of absorbing light from a semiconductor chip, typically a semiconductor LED including a light-emissive layer of nitride semiconductor and converting it to light of different wavelength. Suitable such phosphors include nitride base phosphors and oxynitride base phosphors which are activated mainly with a lanthanoid element such as Eu or Ce; alkaline earth metal halide apatite phosphors which are activated mainly with a lanthanoid element such as Eu or a transition metal element such as Mn, alkaline earth metal borate halide phosphors, alkaline earth metal aluminate phosphors, alkaline earth metal silicate phosphors, alkaline earth metal sulfide phosphors, alkaline earth metal thiogallate phosphors, alkaline earth metal silicon nitride phosphors, and germanate phosphors; rare earth aluminate phosphors which are activated mainly with a lanthanoid element such as Ce; rare earth silicate phosphors;

organic and organic complex phosphors which are activated mainly with a lanthanoid element such as Eu; and Ca—Al—Si—O—N oxynitride glass phosphors, which may be used alone or in admixture.

Exemplary of the nitride phosphors which are activated mainly with a lanthanoid element such as Eu or Ce are $M_2Si_5N_8$:Eu wherein M is at least one element selected from Sr, Ca, Ba, Mg, and Zn. Also included are $MSi_7N_{10}$:Eu, $M_{1.8}Si_5O_{0.2}N_8$:Eu, and $M_{0.9}Si_7O_{0.1}N_{10}$:Eu wherein M is at least one element selected from Sr, Ca, Ba, Mg, and Zn.

Exemplary of the oxynitride phosphors which are activated mainly with a lanthanoid element such as Eu or Ce are $MSi_2O_2N_2$:Eu wherein M is at least one element selected from Sr, Ca, Ba, Mg, and Zn.

Exemplary of the alkaline earth metal halide apatite phosphors which are activated mainly with a lanthanoid element such as Eu or a transition metal element such as Mn are $M_5(PO_4)_3X$:R wherein M is at least one element selected from Sr, Ca, Ba, Mg, and Zn, X is at least one element selected from F, Cl, Br and I, and R is Eu, Mn, or Eu and Mn.

Exemplary of the alkaline earth metal borate halide phosphors are $M_2B_5O_9X$:R wherein M is at least one element selected from Sr, Ca, Ba, Mg, and Zn, X is at least one element selected from F, Cl, Br and I, and R is Eu, Mn, or Eu and Mn.

Exemplary of the alkaline earth metal aluminate phosphors are $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R and $BaMgAl_{10}O_{17}$:R wherein R is Eu, Mn, or Eu and Mn.

Exemplary of the alkaline earth metal sulfide phosphors are $La_2O_2S$:Eu, $Y_2O_2S$:Eu and $Gd_2O_2S$:Eu.

Exemplary of the rare earth aluminate phosphors which are activated mainly with a lanthanoid element such as Ce are YAG base phosphors of the compositional formulae: $Y_3Al_5O_{12}$:Ce, $(Y_{0.8}Gd_{0.2})_3Al_5O_{12}$:Ce, $Y_2(Al_{0.8}Ga_{0.2})_5O_{12}$:Ce, and $(Y,Gd)_3(Al,Ga)_5O_{12}$:Ce. Also included are variants of the foregoing wherein Y is partly or entirely replaced by Tb or Lu, such as $Tb_3Al_5O_{12}$:Ce and $Lu_3Al_5O_{12}$:Ce.

Other suitable phosphors include ZnS:Eu, $Zn_2GeO_4$:Mn, and $MGa_2S_4$:Eu wherein M is at least one element selected from Sr, Ca, Ba, Mg, and Zn, and X is at least one element selected from F, Cl, Br and I.

In the above phosphors, at least one element selected from Tb, Cu, Ag, Au, Cr, Nd, Dy, Co, Ni and Ti may be incorporated instead of Eu or in addition to Eu, if desired.

The Ca—Al—Si—O—N oxynitride glass phosphors are phosphors based on an oxynitride glass matrix consisting of 20 to 50 mol % of $CaCO_3$ (calculated as CaO), 0 to 30 mol % of $Al_2O_3$, 25 to 60 mol % of $SiO$, 5 to 50 mol % of AlN, and 0.1 to 20 mol % of a rare earth oxide or transition metal oxide, the total of five ingredients being 100 mol %. In the phosphors based on an oxynitride glass matrix, the nitrogen content is preferably up to 15% by weight, and besides the rare earth oxide ion, another rare earth ion serving as a sensitizer is preferably contained in the phosphor glass in a content of 0.1 to 10 mol % of rare earth oxide as a co-activator.

Phosphors other than the foregoing may also be used as long as they have equivalent functions and effects.

The phosphor takes the form of particles having an average particle size of preferably at least 10 nm, more preferably 10 nm to 10 μm, and even more preferably 10 nm to 1 μm. Notably, the average particle size is measured by a particle size distribution measurement system CILAS using the laser light diffraction method.

When added, the amount of the phosphor is preferably 0.1 to 2,000 parts, more preferably 0.1 to 100 parts by weight per 100 parts by weight of the other components, typically components (A) to (C) combined. When the cured product of the addition curable silicone composition takes the form of a phosphor-containing film for wavelength conversion, the phosphor amount is preferably 10 to 2,000 parts by weight.

Inorganic Filler

Suitable inorganic fillers include silica, fumed silica, fumed titanium dioxide, alumina, calcium carbonate, calcium silicate, titanium dioxide, ferric oxide, and zinc oxide, which may be used alone or in admixture. When added, the amount of the filler is preferably up to 20 parts, more preferably 0.1 to 10 parts by weight per 100 parts by weight of components (A) to (C) combined, but not limited thereto.

Adhesive Aid

An adhesive aid may be added to the addition curable silicone composition for imparting adhesion thereto, if desired. Suitable adhesive aids are organosiloxane oligomers of preferably 4 to 50 silicon atoms, more preferably 4 to 20 silicon atoms, having at least one substituent selected from silicon-bonded hydrogen and alkenyl and at least one of alkoxy group, epoxy group and nitrogen-containing substituent.

Also useful as the adhesive aid are organooxysilyl-modified isocyanurate compounds having the formula (14) below and hydrolytic condensates thereof (i.e., organosiloxane-modified isocyanurate compounds).

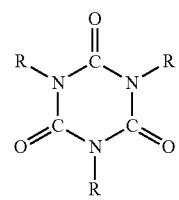

(14)

In formula (14), R is each independently an organic group having the formula (15) below, or a monovalent unsaturated aliphatic hydrocarbon group, with the proviso that at least one R is an organic group of formula (15).

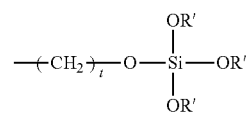

(15)

Herein R is hydrogen or a $C_1$-$C_6$ monovalent hydrocarbon group such as methyl or ethyl, and t is an integer of 1 to 6, preferably 1 to 4.

In formula (14), the monovalent unsaturated aliphatic hydrocarbon group represented by R may optionally contain oxygen, and is preferably selected from hydrocarbon groups of 2 to 8 carbon atoms, more preferably 2 to 6 carbon atoms, for example, linear or branched alkenyl groups such as vinyl, allyl, 1-butenyl, 1-hexenyl and 2-methylpropenyl, and (meth)acrylic groups.

This compound is different from components (A), (B), (D) and (E) in that it contains an alkoxy group, epoxy group or nitrogen-containing substituent.

When added, the amount of the adhesive aid is preferably up to 10 parts, more preferably 0.1 to 8 parts, and even more preferably 0.2 to 5 parts by weight per 100 parts by weight of components (A) to (C) combined. As long as the amount is equal to or less than the upper limit, the cured product has a high hardness and a less surface tack.

The adhesive aid is preferably added in such amounts that the ratio of the total number of hydrosilyl groups in the entire composition to the total number of alkenyl groups in the entire composition may be in a range from 0.4/1 to 4/1, more preferably 0.6/1 to 3/1, and even more preferably 0.8/1 to 2/1.

Further the adhesive aid is preferably added in an amount of 0.05 to 10%, more preferably 0.1 to 5%, and even more preferably 0.2 to 3% by weight based on the total weight of components (A), (B), (D) and (E). This range of the adhesive aid is effective for improving the adhesion of the silicone composition without sacrificing its benefits.

Cure Inhibitor

A cure inhibitor may be added to the addition curable silicone composition for controlling reactivity to enhance shelf stability, if desired. Suitable cure inhibitors include triallyl isocyanurate, alkyl maleates, acetylene alcohols, silane or siloxane-modified products thereof, hydroperoxide, tetramethylethylenediamine, benzotriazole, and mixtures thereof. When added, the amount of the cure inhibitor is preferably 0.001 to 1 part, more preferably 0.005 to 0.5 part by weight per 100 parts by weight of components (A) to (C) combined.

Other Additives

Besides the above components, other additives may be added to the silicone composition. Suitable additives include an antidegradant, radical scavenger, flame retardant, surfactant, ozone degradation inhibitor, photostabilizer, thickener, plasticizer, antioxidant, heat stabilizer, conductive agent, antistatic agent, radiation shielding agent, nucleating agent, phosphorus peroxide decomposing agent, lubricant, pigment, metal inactivating agent, physical property regulator, and organic solvent. These optional additives may be used alone or in admixture.

The simplest embodiment of the addition curable silicone composition is a composition consisting of components (A), (B) and (C). Particularly when it is desired that a cured product have high transparency, the composition should preferably be free of an inorganic filler such as silica filler. Examples of the inorganic filler are as described above.

The method for preparing the addition curable silicone composition is not particularly limited. The silicone composition may be prepared by any prior art well-known methods, for example, by mixing components (A), (B), (C), optionally components (D), (E) and other components in a standard way. For example, the components are fed into a commercially available mixer (e.g., Thinky Conditioning Mixer by Thinky Corp.) where they are mixed for about 1 to 5 minutes until uniform.

The method for curing the addition curable silicone composition is not particularly limited. The silicone composition may be cured by any prior art well-known methods, for example, by heating at 60 to 180° C. for about 1 to 12 hours. Preferably the silicone composition is cured by stepwise heating at temperatures in the range of 60 to 150° C. The stepwise curing preferably includes two steps. Specifically, the silicone composition is heated at a temperature of 60 to 100° C. for 0.5 to 2 hours for achieving full deaeration before it is heated at a temperature of 120 to 180° C. for 1 to 10 hours for heat curing. Such stepwise curing ensures that even when the composition to be cured is thick walled, it is fully cured into a colorless transparent product without bubbles. The term "colorless transparent product" means that a cured part of 1 mm thick has a light transmittance of at least 80%, preferably at least 85%, and most preferably at least 90% at wavelength 450 nm.

Since the addition curable silicone composition cures into a product having a high light transmittance, it is suited for the encapsulation of LED chips, especially blue and purple LED chips. An LED chip or microelectronic device may be encapsulated with the addition curable silicone composition by any prior art well-known methods, for example, dispensing or compression molding.

Since the addition curable silicone composition cures at a high cure rate into a product having crack resistance, heat resistance, light resistance and transparency, it is also suited in a variety of applications including display materials, optical recording media materials, optical equipment materials, optical part materials, optical fiber materials, optoelectronic functional organic materials, and semiconductor IC-related materials.

EXAMPLE

Examples of the invention are given below by way of illustration and not by way of limitation. In Examples, all parts are by weight (pbw) unless otherwise indicated. In the chemical formulae, Vi stands for vinyl. A weight average molecular weight (Mw) was measured by gel permeation chromatography (GPC) versus polystyrene standards under the following conditions.

GPC Analysis Conditions

Developing solvent: tetrahydrofuran (THF)

Flow rate: 0.6 mL/min

Column: TSK Guardcolumn SuperH-L

TSKgel SuperH4000 (6.0 mm ID×15 cm×1)

TSKgel SuperH3000 (6.0 mm ID×15 cm×1)

TSKgel SuperH2000 (6.0 mm ID×15 cm×2) (all Tosoh Corp.)

Column temperature: 40° C.

Sample injection volume:

20 μL (sample concentration: 0.5 wt % THF solution)

Detector: differential refractive index (RI) detector

Proton nuclear magnetic resonance ($^1$H-NMR) spectra were measured on a spectrometer ULTRASHIELD® 400PLUS (Bruker).

In Examples, the amount of Si—H groups was determined by dissolving 0.2 g of the product in 15 g of 1-butanol, adding 20 g of a 20 wt % sodium hydroxide aqueous solution thereto while stirring at 25° C., measuring the volume ($V_H$) of hydrogen gas generated, and applying it to the equation of state of gas.

$$\text{Si—H amount (mol/100 g)} = 1/\{(0.2\ [g]) \times 0.0821\ [\text{atm} \cdot \text{dm}^3 \cdot \text{mol}^{-1} \cdot \text{K}^{-1}] \times (25+273\ [K])/(1\ [\text{atm}]) \times V_H\ [\text{dm}^3]\}$$

The Vi value (mol/100 g) shown below was determined by measuring a $^1$H-NMR spectrum of the compound at 400 MHz, and computing integrated values of hydrogen atoms using dimethyl sulfoxide as internal standard.

The compounds used in Examples have the following structures.

(1) Diphenylsilane Diol

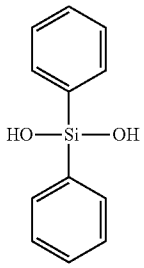

(2) Both End Hydroxy-Capped diphenylpolysiloxane

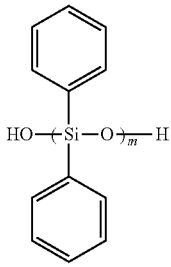

m = av 3

(3) Both End Hydroxy-Capped methylphenylpolysiloxane A

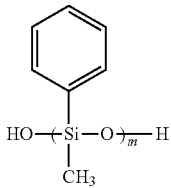

m = av 7

(4) Both End Hydroxy-Capped methylphenylpolysiloxane B

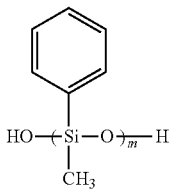

m = av 20

(5) Both End Hydroxy-Capped dimethylpolysiloxane A

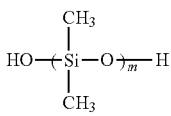

m = av 20

(6) Both End Hhydroxy-Capped dimethylpolysiloxane B

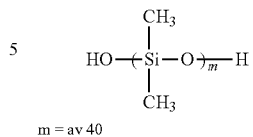

m = av 40

(7) Trimethoxysilane

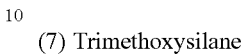

(8) Tetramethoxysilane

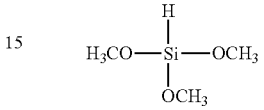

(9) Methyltrimethoxysilane

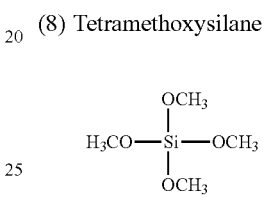

(10) Phenyltrimethoxysilane

(11) Methyltrimethoxysilane Oligomer

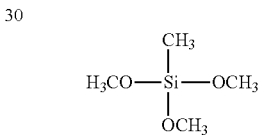

n = av 2

(12) Tetramethoxysilane Oligomer

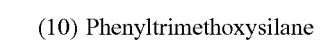

n = av 4

(13) Dimethylchlorosilane

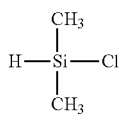

(14) 1,1,3,3-Tetramethyldisiloxane

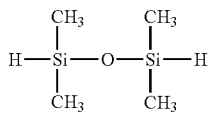

EXAMPLE 1

Figure 2:
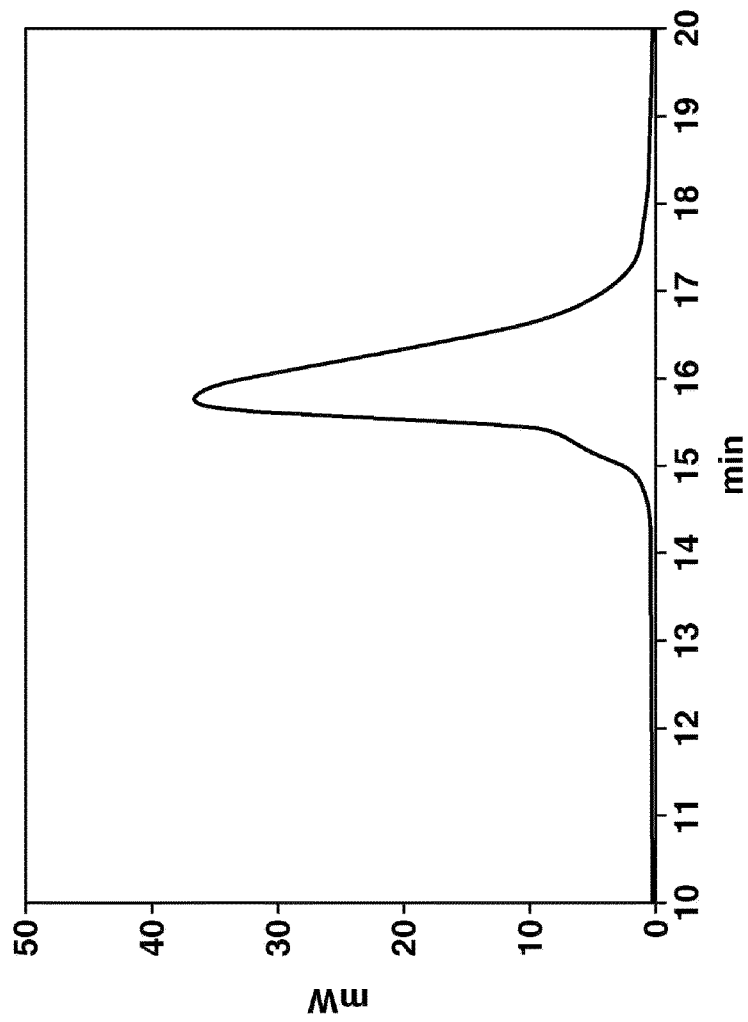
FIG. 2 is a diagram showing GPC chart of the hydrosilyl-containing organopolysiloxane in Example 1.

In a reactor, 216.31 g (1.0 mol) of diphenylsilane diol (1) and 608.90 g (4.0 mol) of tetramethoxysilane (8) were mixed and adjusted to a temperature of 10° C. while stirring. Then 10 g of Ca(OH)$_2$ was added, whereupon reaction was run at 10° C. for 16 hours. The catalyst was removed from the reaction product by filtration, and the solvent and unreacted tetramethoxysilane were distilled off under reduced pressure. Below 10° C., 483.60 g (3.6 mol) of 1,1,3,3-tetramethyldisiloxane (14) was added to the residue and thoroughly stirred. Then 200 g of 3 wt % sulfuric acid water was added dropwise such that the temperature was kept below 10° C., whereupon endcapping reaction was run at 25° C. for 8 hours. The product was purified by water washing and vacuum distillation, yielding a hydrosilyl-containing organopolysiloxane of the formula shown below. Mw=926, Si—H amount=0.84 mol/100 g. The $^1$H-NMR spectrum and GPC chart of the product are shown in FIGS. 1 and 2, respectively. The integrated values of the $^1$H-NMR spectrum were Si—CH$_3$ (−0.5-0.5 ppm): 38.1, Si—H (4-5 ppm): 6.0, Si—C$_6$H$_5$ (6.8-7.8 ppm): 12.2.

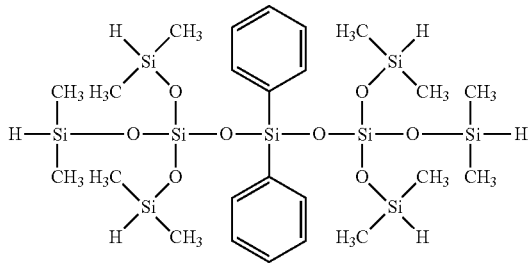 [SMILES: C[SiH](C)O[Si](O[SiH](C)C)(O[SiH](C)C)O[Si](O[Si](O[SiH](C)C)(O[SiH](C)C)O[SiH](C)C)(c1ccccc1)c1ccccc1]

EXAMPLE 2

Figure 3:
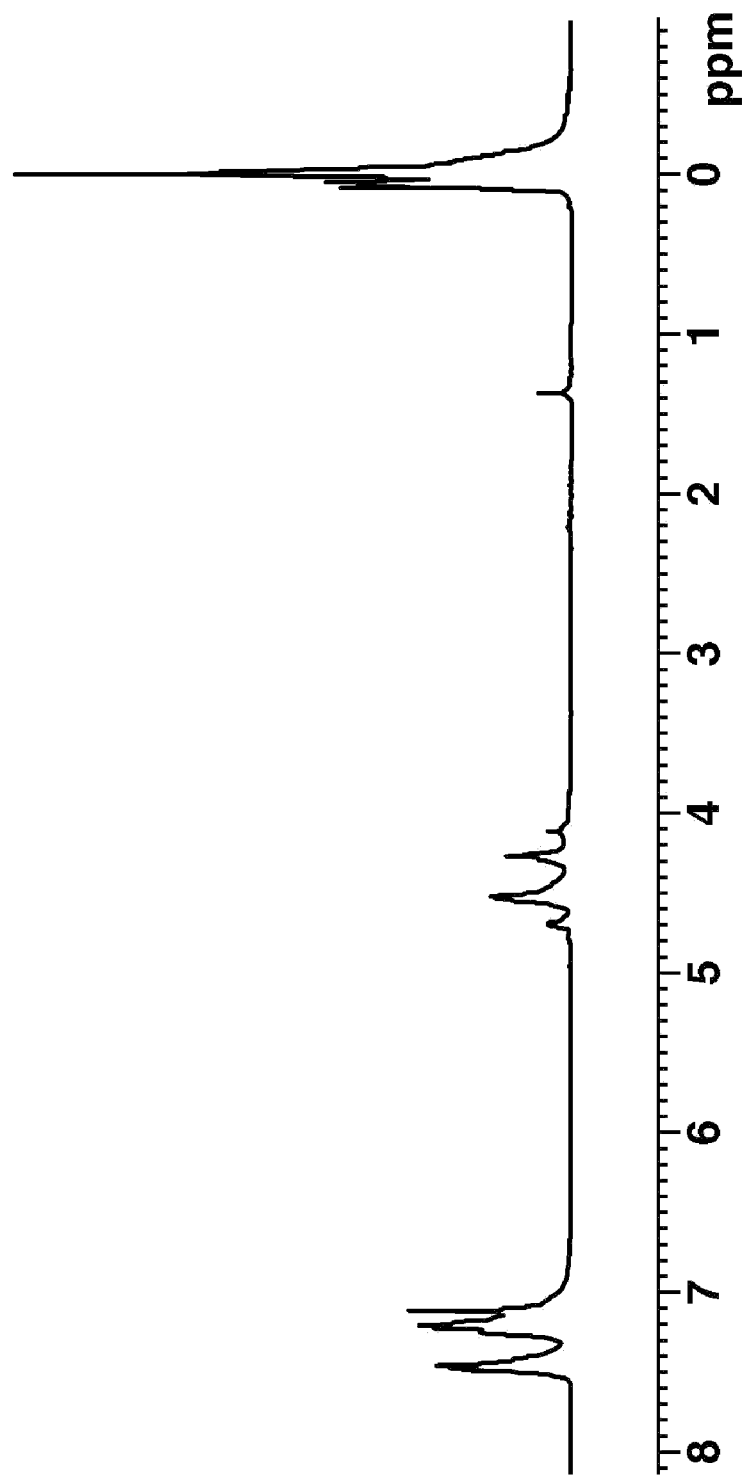
FIG. 3 is a diagram showing $^1$H-NMR spectrum of a hydrosilyl-containing organopolysiloxane in Example 2.
Figure 4:
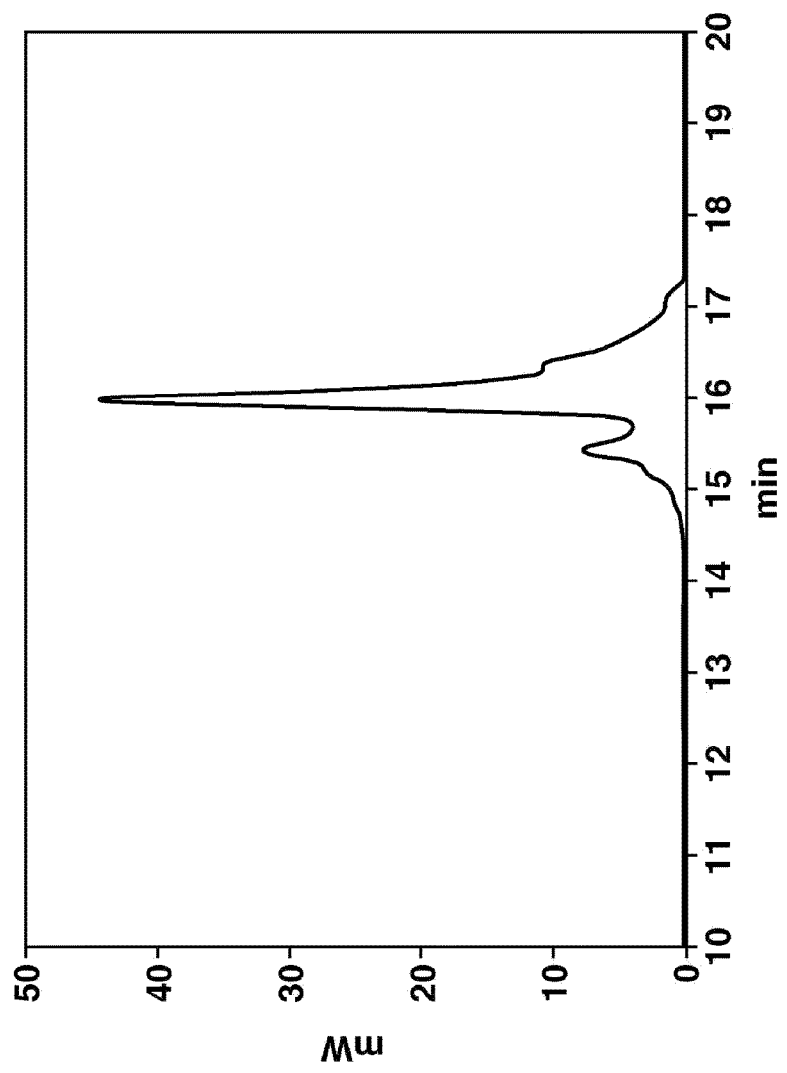
FIG. 4 is a diagram showing GPC chart of the hydrosilyl-containing organopolysiloxane in Example 2.

In a reactor, 216.31 g (1.0 mol) of diphenylsilane diol (1), 484.77 g (4.0 mol) of trimethoxysilane (7), 200 g of toluene, and 60 g of methanol were mixed and adjusted to a temperature of 30° C. while stirring. Then 10 g of Mg(OH)$_2$ was added, whereupon reaction was run at 30° C. for 8 hours. The catalyst was removed from the reaction product by filtration, and the solvent and unreacted trimethoxysilane were distilled off under reduced pressure. The residue was cooled to 0-10° C., after which 322.40 g (2.4 mol) of 1,1,3,3-tetramethyldisiloxane (14) was added and thoroughly stirred. Then 150 g of 3 wt % sulfuric acid water was added dropwise such that the temperature was kept below 10° C., whereupon endcapping reaction was run at 25° C. for 8 hours. The product was purified by water washing and vacuum distillation, yielding a hydrosilyl-containing organopolysiloxane of the formula shown below. Mw=769, Si—H amount=1.01 mol/100 g. The $^1$H-NMR spectrum and GPC chart of the product are shown in FIGS. 3 and 4, respectively. The integrated values of the $^1$H-NMR spectrum were Si—CH$_3$ (−0.5-0.5 ppm): 23.5, Si—H (4-5 ppm): 6.0, Si—C$_6$H$_5$ (6.8-7.8 ppm): 13.6.

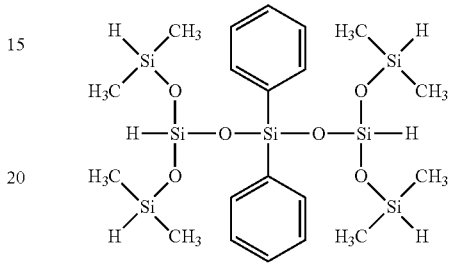

EXAMPLE 3

In a reactor, 612.89 g (1.0 mol) of both end hydroxy-capped diphenylpolysiloxane (2), 484.77 g (4.0 mol) of trimethoxysilane (7), 400 g of toluene, and 60 g of methanol were mixed and adjusted to a temperature of 30° C. while stirring. Then 20 g of Mg(OH)$_2$ was added, whereupon reaction was run at 30° C. for 16 hours. The catalyst was removed from the reaction product by filtration, and the solvent and unreacted trimethoxysilane were distilled off under reduced pressure. The residue was cooled to 0-10° C., whereupon 322.40 g (2.4 mol) of 1,1,3,3-tetramethyldisiloxane (14) was added and thoroughly stirred. Then 150 g of 3 wt % sulfuric acid water was added dropwise such that the temperature was kept below 10° C., whereupon endcapping reaction was run at 25° C. for 8 hours. The product was purified by water washing and vacuum distillation, yielding a hydrosilyl-containing organopolysiloxane of the formula shown below. Mw=1,216, Si—H amount=0.60 mol/100 g. The integrated values of the $^1$H-NMR spectrum were Si—CH$_3$ (−0.5-0.5 ppm): 24.3, Si—H (4-5 ppm): 6.0, Si—C$_6$H$_5$ (6.8-7.8 ppm): 34.1.

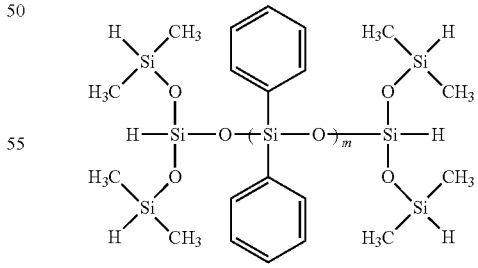

m = av 3

EXAMPLE 4

In a reactor, 216.31 g (1.0 mol) of diphenylsilane diol (1), 544.90 g (4.0 mol) of methyltrimethoxysilane (9), 200 g of toluene, and 60 g of methanol were mixed and adjusted to a temperature of 60° C. while stirring. Then 10 g of Ca(OH)$_2$ was added, whereupon reaction was run at 60° C. for 8 hours. The catalyst was removed from the reaction product by filtration, and the solvent and unreacted methyltrimethoxysilane were distilled off under reduced pressure. The residue was cooled to 0-10° C., whereupon 322.40 g (2.4 mol) of 1,1,3,3-tetramethyldisiloxane (14) was added and thoroughly stirred. Then 150 g of 3 wt % sulfuric acid water was added dropwise such that the temperature was kept below 10° C., whereupon endcapping reaction was run at 25° C. for 16 hours. The product was purified by water washing and vacuum distillation, yielding a hydrosilyl-containing organopolysiloxane of the formula shown below. Mw=809, Si—H amount=0.66 mol/100 g. The integrated values of the $^1$H-NMR spectrum were Si—CH$_3$ (−0.5-0.5 ppm): 26.0, Si—H (4-5 ppm): 4.0, Si—C$_6$H$_5$ (6.8-7.8 ppm): 12.9.

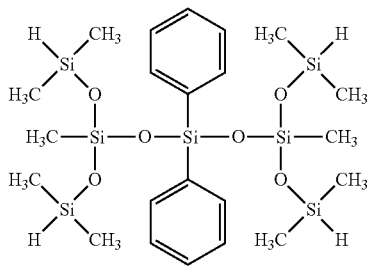 [SMILES: C[SiH](C)O[Si](C)(O[SiH](C)C)O[Si](O[Si](C)(O[SiH](C)C)O[SiH](C)C)(c1ccccc1)c1ccccc1]

EXAMPLE 5

In a reactor, 216.31 g (1.0 mol) of diphenylsilane diol (1), 793.17 g (4.0 mol) of phenyltrimethoxysilane (10), 200 g of toluene, and 60 g of methanol were mixed and adjusted to a temperature of 60° C. while stirring. Then 15 g of Sr(OH)$_2$ was added, whereupon reaction was run at 60° C. for 8 hours. The catalyst was removed from the reaction product by filtration, and the solvent and unreacted phenyltrimethoxysilane were distilled off under reduced pressure. The residue was cooled to 0-10° C., whereupon 322.40 g (2.4 mol) of 1,1,3,3-tetramethyldisiloxane (14) was added and thoroughly stirred. Then 150 g of 3 wt % sulfuric acid water was added dropwise such that the temperature was kept below 10° C., whereupon endcapping reaction was run at 25° C. for 16 hours. The product was purified by water washing and vacuum distillation, yielding a hydrosilyl-containing organopolysiloxane of the formula shown below. Mw=984, Si—H amount=0.52 mol/100 g. The integrated values of the $^1$H-NMR spectrum were Si—CH$_3$ (−0.5-0.5 ppm): 25.8, Si—H (4-5 ppm): 4.0, Si—C$_6$H$_5$ (6.8-7.8 ppm): 23.3.

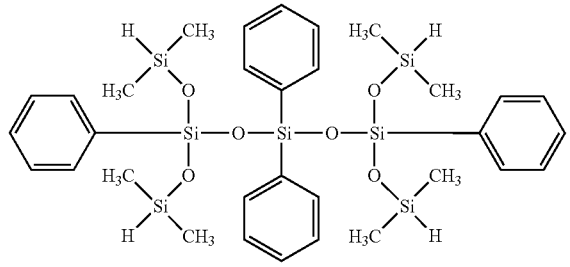 [SMILES: C[SiH](C)O[Si](O[SiH](C)C)(O[Si](O[Si](O[SiH](C)C)(O[SiH](C)C)c1ccccc1)(c1ccccc1)c1ccccc1)c1ccccc1]

EXAMPLE 6

In a reactor, 216.31 g (1.0 mol) of diphenylsilane diol (1), 905.54 g (4.0 mol) of methyltrimethoxysilane oligomer (11), and 60 g of methanol were mixed and adjusted to a temperature of 60° C. while stirring. Then 20 g of Ca(OH)$_2$ was added, whereupon reaction was run at 60° C. for 8 hours. The catalyst was removed from the reaction product by filtration, and the solvent and unreacted methyltrimethoxysilane oligomer were distilled off under reduced pressure. The residue was cooled to 0-10° C., whereupon 681.24 g (7.2 mol) of dimethylchlorosilane (13) was added and thoroughly stirred. Then 400 g of 15 wt % hydrochloric acid water was added dropwise such that the temperature was kept below 20° C., whereupon endcapping reaction was run at 25° C. for 16 hours. The product was purified by water washing and vacuum distillation, yielding a hydrosilyl-containing organopolysiloxane of the formula shown below. Mw=1,029, Si—H amount=0.70 mol/100 g. The integrated values of the $^1$H-NMR spectrum were Si—CH$_3$ (−0.5-0.5 ppm): 45.1, Si—H (4-5 ppm): 6.0, Si—C$_6$H$_5$ (6.8-7.8 ppm): 10.8.

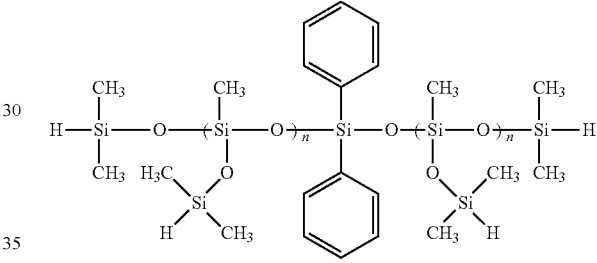

n = av 2

EXAMPLE 7

In a reactor, 612.89 g (1.0 mol) of both end hydroxy-capped diphenylpolysiloxane (2), 1882.8 g (4.0 mol) of tetramethoxysilane oligomer (12), and 400 g of toluene were mixed and adjusted to a temperature of 60° C. while stirring. Then 25 g of Sr(OH)$_2$.8H$_2$O was added, whereupon reaction was run at 60° C. for 8 hours. The catalyst was removed from the reaction product by filtration, and the solvent and unreacted tetramethoxysilane oligomer were distilled off under reduced pressure. The residue was cooled to 0-10° C., whereupon 1021.85 g (10.8 mol) of dimethylchlorosilane (13) was added and thoroughly stirred. Then 400 g of 15 wt % hydrochloric acid water was added dropwise such that the temperature was kept below 20° C., whereupon endcapping reaction was run at 25° C. for 16 hours. The product was purified by water washing and vacuum distillation, yielding a hydrosilyl-containing organopolysiloxane of the formula shown below. Mw=2,377, Si—H amount=0.81 mol/100 g. The integrated values of the $^1$H-NMR spectrum were Si—CH$_3$ (−0.5-0.5 ppm): 116.2, Si—H (4-5 ppm): 18.0, Si—C$_6$H$_5$ (6.8-7.8 ppm): 30.5.

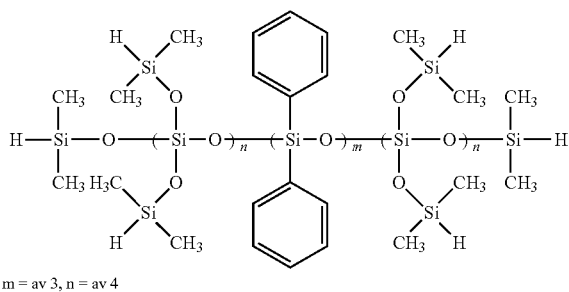

m = av 3, n = av 4

EXAMPLE 8

In a reactor, 971.58 g (1.0 mol) of both end hydroxy-capped methylphenylpolysiloxane A (3) and 608.90 g (4.0 mol) of tetramethoxysilane (8) were mixed and adjusted to a temperature of 10° C. while stirring. Then 20 g of Ca(OH)$_2$ was added, whereupon reaction was run at 10° C. for 16 hours. The catalyst was removed from the reaction product by filtration, and the solvent and unreacted tetramethoxysilane were distilled off under reduced pressure. Below 10° C., 483.60 g (3.6 mol) of 1,1,3,3-tetramethyldisiloxane (14) was added to the residue and thoroughly stirred. Then 200 g of 3 wt % sulfuric acid water was added dropwise such that the temperature was kept below 10° C., whereupon endcapping reaction was run at 25° C. for 8 hours. The product was purified by water washing and vacuum distillation, yielding a hydrosilyl-containing organopolysiloxane of the formula shown below. Mw=1,701, Si—H amount=0.41 mol/100 g. The integrated values of the $^1$H-NMR spectrum were Si—CH$_3$ (−0.5-0.5 ppm): 60.0, Si—H (4-5 ppm): 6.0, Si—C$_6$H$_5$ (6.8-7.8 ppm): 37.6.

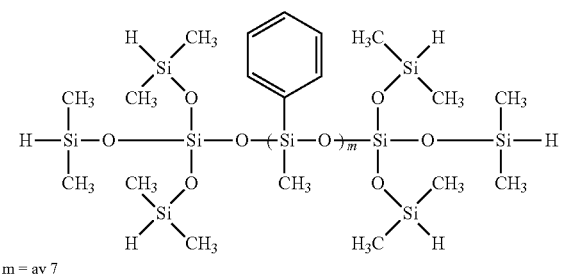

m = av 7

EXAMPLE 9

In a reactor, 2742.5 g (1.0 mol) of both end hydroxy-capped methylphenylpolysiloxane B (4), 1882.8 g (4.0 mol) of tetramethoxysilane oligomer (12), and 1,000 g of toluene were mixed and adjusted to a temperature of 60° C. while stirring. Then 50 g of Sr(OH)$_2$.8H$_2$O was added, whereupon reaction was run at 60° C. for 8 hours. The catalyst was removed from the reaction product by filtration, and the solvent and unreacted tetramethoxysilane oligomer were distilled off under reduced pressure. Toluene, 1,000 g, was added to the residue, which was cooled to 0-10° C., whereupon 1021.85 g (10.8 mol) of dimethylchlorosilane (13) was added and thoroughly stirred. Then 400 g of 15 wt % hydrochloric acid water was added dropwise such that the temperature was kept below 20° C., whereupon endcapping reaction was run at 25° C. for 16 hours. The product was purified by water washing and vacuum distillation, yielding a hydrosilyl-containing organopolysiloxane of the formula shown below. Mw=4,558, Si—H amount=0.42 mol/100 g. The integrated values of the $^1$H-NMR spectrum were Si—CH$_3$ (−0.5-0.5 ppm): 136.3, Si—H (4-5 ppm): 18.0, Si—C$_6$H$_5$ (6.8-7.8 ppm): 99.6.

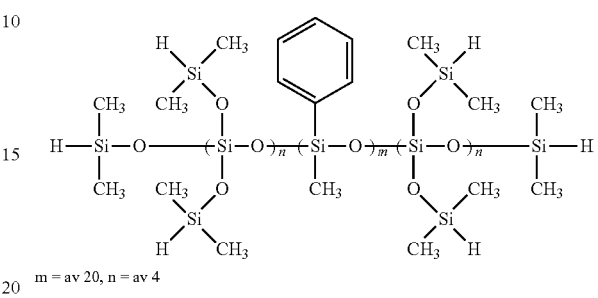

m = av 20, n = av 4

EXAMPLE 10

In a reactor, 1501.18 g (1.0 mol) of both end hydroxy-capped dimethylpolysiloxane A (5) and 905.54 g (4.0 mol) of methyltrimethoxysilane oligomer (11) were mixed and adjusted to a temperature of 60° C. while stirring. Then 80 g of benzylamine was added, whereupon reaction was run at 60° C. for 8 hours. To the reaction solution, 0.25 mol of acetic acid was added for neutralization. The amine salt of acetic acid was removed by filtration, and the solvent and unreacted methyltrimethoxysilane oligomer were distilled off under reduced pressure. Toluene, 500 g, was added to the residue, which was cooled to 0-10° C., whereupon 1021.85 g (10.8 mol) of dimethylchlorosilane (13) was added and thoroughly stirred. Then 400 g of 15 wt % hydrochloric acid water was added dropwise such that the temperature was kept below 20° C., whereupon endcapping reaction was run at 25° C. for 16 hours. The product was purified by water washing and vacuum distillation, yielding a hydrosilyl-containing organopolysiloxane of the formula shown below. Mw=2,360, Si—H amount=0.27 mol/100 g. The integrated values of the $^1$H-NMR spectrum were Si—CH$_3$ (−0.5-0.5 ppm): 177.6, and Si—H (4-5 ppm): 6.0.

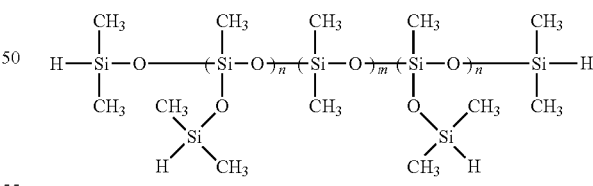

m = av 20, n = av 2

EXAMPLE 11

In a reactor, 2382.98 g (1.0 mol) of both end hydroxy-capped dimethylpolysiloxane B (6) and 1882.8 g (4.0 mol) of tetramethoxysilane oligomer (12) were mixed and adjusted to a temperature of 60° C. while stirring. Then 140 g of n-butylamine was added, whereupon reaction was run at 60° C. for 8 hours. To the reaction solution, 0.5 mol of acetic acid was added for neutralization, the amine salt of acetic acid was removed by filtration, and the solvent and unreacted tetramethoxysilane oligomer were distilled off under reduced pressure. Toluene, 500 g, was added to the residue, which was cooled to 0-10° C., whereupon 1021.85 g (10.8 mol) of dimethylchlorosilane (13) was added and thoroughly stirred. Then 400 g of 15 wt % hydrochloric acid water was added dropwise such that the temperature was kept below 20° C., whereupon endcapping reaction was run at 25° C. for 16 hours. The product was purified by water washing and vacuum distillation, yielding a hydrosilyl-containing organopolysiloxane of the formula shown below. Mw=4,868, Si—H amount=0.36 mol/100 g. The integrated values of the $^1$H-NMR spectrum were Si—CH$_3$ (−0.5-0.5 ppm): 358.0 and Si—H (4-5 ppm): 18.0.

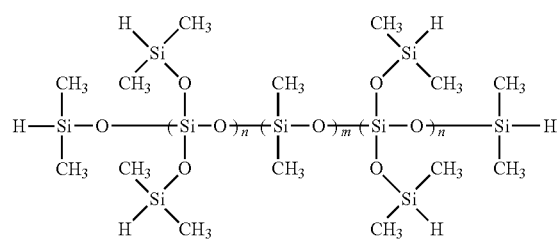

m = av 40, n = av 4

The following Examples and Comparative Examples refer to addition curable silicone compositions. Components (A), (B), (C), (D), and (E) used herein are identified below.

(A-1) Silicone fluid having the following formula (available from Shin-Etsu Chemical Co., Ltd., Vi value=0.038 mol/100 g)

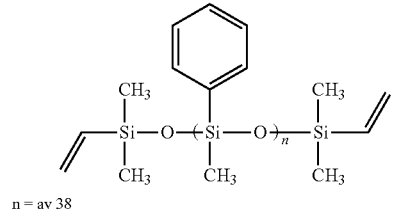

n = av 38

(A-2) Silicone fluid having the following formula (available from Shin-Etsu Chemical Co., Ltd., Vi value=0.022 mol/100 g)

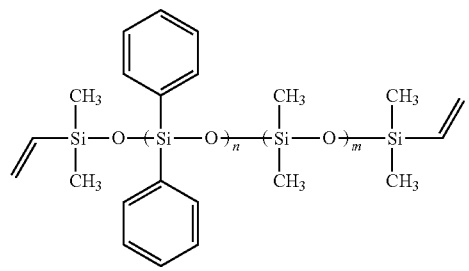

n = 6, m = av 104

(A-3) Silicone fluid having the following formula (available from Shin-Etsu Chemical Co., Ltd., Vi value=0.013 mol/100 g)

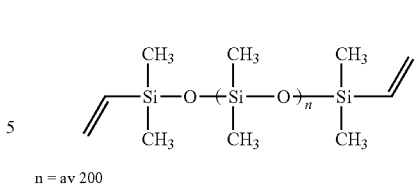

n = av 200

(A-4) Silicone fluid having the following formula (available from Shin-Etsu Chemical Co., Ltd., Vi value =0.003 mol/100 g)

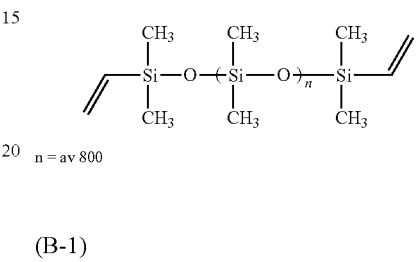

n = av 800

(B-1)

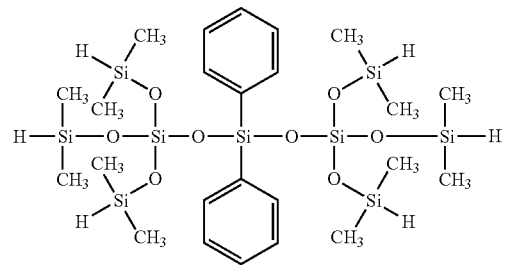 [SMILES: C[SiH](C)O[Si](O[SiH](C)C)(O[SiH](C)C)O[Si](O[Si](O[SiH](C)C)(O[SiH](C)C)O[SiH](C)C)(c1ccccc1)c1ccccc1]

(B-2)

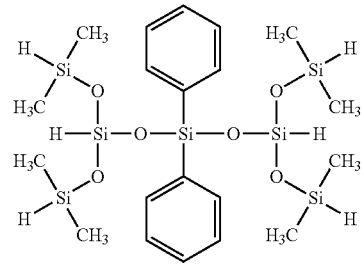 [SMILES: C[SiH](C)O[SiH](O[SiH](C)C)O[Si](O[SiH](O[SiH](C)C)O[SiH](C)C)(c1ccccc1)c1ccccc1]

(B-3)

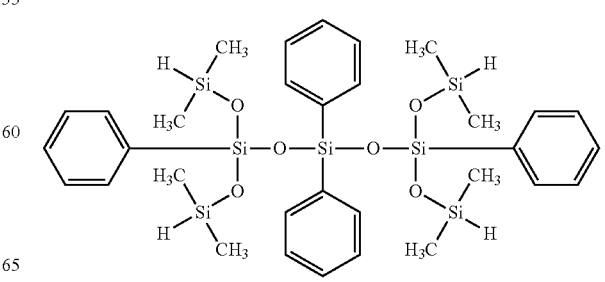

(B-4)

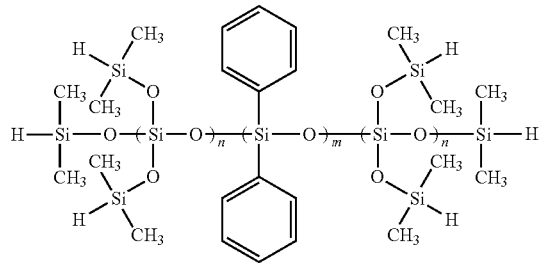

m = av 3, n = av 4

(B-5)

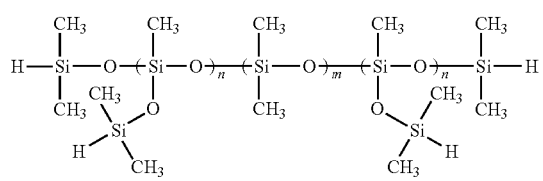

m = av 20, n = av 2

(B-6)

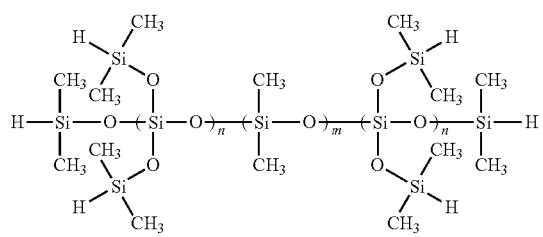

m = av 40, n = av 4

(B'-1) Branched organohydrogensiloxane having the following formula (available from Shin-Etsu Chemical Co., Ltd., SiH value=0.90 mol/100 g)

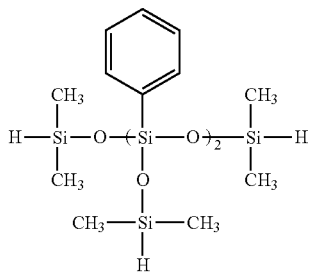

(C) Divinylsiloxane complex of chloroplatinic acid (containing 2×10⁻⁴ wt % of platinum metal)

(D-1) Phenyl base silicone resin having the following formula (available from Shin-Etsu Chemical Co., Ltd., Vi value=0.147 mol/100 g, Mw=1,563)

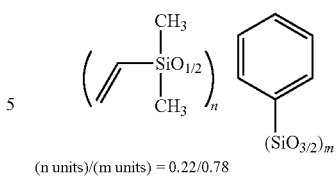

(n units)/(m units) = 0.22/0.78

(D-2) Methyl base silicone resin having the following formula (available from Shin-Etsu Chemical Co., Ltd., Vi value=0.091 mol/100 g, Mw=5,211)

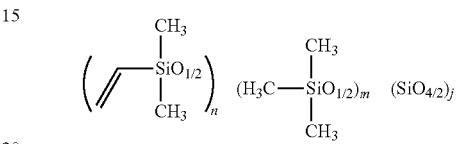

(n units)/(m units)/(j units) = 0.06/0.36/0.58

(E-1) Linear organohydrogensiloxane having the following formula (available from Shin-Etsu Chemical Co., Ltd., SiH value=0.60 mol/100 g)

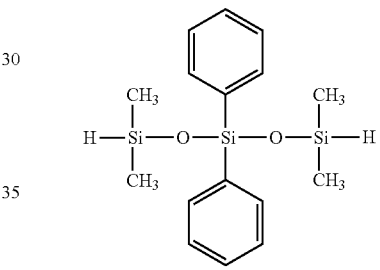

(E-2) Linear organohydrogenpolysiloxane having the following formula (available from Shin-Etsu Chemical Co., Ltd., SiH value=0.91 mol/100 g)

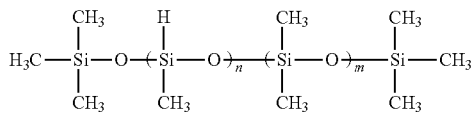

m = av 28, n = av 16

EXAMPLES 12 TO 18 AND COMPARATIVE EXAMPLES 1 TO 4

Silicone compositions were prepared by mixing the components exclusive of the catalyst in the amounts shown in Table 1, adding an amount of the catalyst so as to give 2 ppm of platinum based on the total weight of the composition, and further mixing them. These silicone compositions were examined by the following tests. In Table 1, the value of H/Vi is a ratio of the total number of hydrosilyl groups to the total number of vinyl groups in the overall composition.

(1) Hardness of Cured Product

The silicone composition was cast into an aluminum dish of 50 mm diameter and 10 mm thick, and cured stepwise at 60° C. for 1 hour, at 100° C. for 1 hour, and at 150° C. for 4 hours. The cured product was measured for hardness by Durometer Type A or Type D according to JIS K 6253-3: 2012. To examine the time (full cure time) taken until the measured hardness of the cured product was reached, the hardness of a composition being cured was similarly measured in the 150° C. step at intervals of 5 minutes from 0 to 30 minutes and at intervals of 10 minutes from 30 to 120 minutes.

(2) Light Transmittance and Heat Resistance of Cured Product

A concave polytetrafluoroethylene spacer of 1 mm thick was sandwiched between two slide glass plates of 50 mm×20 mm×1 mm thick and fixedly secured. The silicone composition was cast into the space, and cured stepwise at 60° C. for 1 hour, at 100° C. for 1 hour, and at 150° C. for 4 hours. The cured sample was measured for light transmittance at wavelength 450 nm on a spectrometer U-4100 (Hitachi High-Technologies Corp.). The sample was allowed to stand at 150° C. for 1,000 hours before it was measured for light transmittance at 450 nm again, which was reported as an index of heat resistance.

(3) Tensile Strength and Elongation at Break of Cured Product

The silicone composition was cast into a concave polytetrafluoroethylene mold of 150 mm×200 mm×2 mm thick and cured stepwise at 60° C. for 1 hour, at 100° C. for 1 hour, and at 150° C. for 4 hours. The cured sample was measured for tensile strength and elongation at break on a tensile tester EZ TEST (EZ-L by Shimadzu Corp.) according to JIS K 6251:2010 under conditions including a separation rate of 500 mm/min, a distance between grips of 80 mm, and a distance between two gage marks of 40 mm.

(4) Cure Rate

Using an analyzer APA 2000 of Alpha Technologies, a change with time of storage elastic modulus G' (Pa) of the silicone composition at 80° C. was measured under conditions including a frequency of 100 cpm and a strain amplitude of 0.75 deg. A curve was drawn by plotting tan δ values computed from measurements of storage elastic modulus, from which a time corresponding to the peak top was read out and reported as gelling time.

(5) Water Vapor Permeability

The silicone composition was cast into a concave polytetrafluoroethylene mold of 150 mm×200 mm×2 mm thick and cured stepwise at 60° C. for 1 hour, at 100° C. for 1 hour, and at 150° C. for 12 hours. The cured sample was measured for water vapor permeability by a water vapor permeation analyzer Lyssy L80-5000 (Lyssy) according to JIS K 7129.

(6) Thermal Cycling Test

The silicone composition was dispensed on a Tiger 3528 package (Shin-Etsu Chemical Co., Ltd.) and cured stepwise at 60° C. for 1 hour, at 100° C. for 1 hour, and at 150° C. for 4 hours, obtaining a sample in which the package was encapsulated with the cured composition. Twenty samples were tested by a thermal cycling test (TCT) between −50° C. and 140° C. over 1,000 cycles. The number of samples in which the encapsulant was cracked was counted.

The test results are shown in Tables 2 and 3.

TABLE 1

| Compounding amount (pbw) | | Example | | | | | | | Comparative Example | | | |
|---|---|---|---|---|---|---|---|---|---|---|---|---|
| | | 12 | 13 | 14 | 15 | 16 | 17 | 18 | 1 | 2 | 3 | 4 |
| (A) | (A-1) | 100 | 100 | — | 100 | 100 | — | — | 100 | 100 | — | — |
| | (A-2) | — | — | 100 | — | — | — | — | — | — | 100 | — |
| | (A-3) | — | — | — | — | — | 100 | — | — | — | — | 100 |
| | (A-4) | — | — | — | — | — | — | 100 | — | — | — | — |
| (B) | (B-1) | 2.7 | 0.31 | — | — | — | — | — | — | — | — | — |
| | (B-2) | — | — | 7.62 | — | — | — | — | — | — | — | — |
| | (B-3) | — | — | — | 83.9 | — | — | — | — | — | — | — |
| | (B-4) | — | — | — | — | 14.0 | — | — | — | — | — | — |
| | (B-5) | — | — | — | — | — | 41.8 | — | — | — | — | — |
| | (B-6) | — | — | — | — | — | — | 1.7 | — | — | — | — |
| | (B'-1) | — | — | — | — | — | — | — | 2.6 | — | 8.6 | — |
| (D) | (D-1) | 50 | 50 | — | 900 | 5 | — | — | 50 | 50 | — | — |
| | (D-2) | — | — | — | — | — | 100 | 50 | — | — | — | 100 |
| (E) | (E-1) | 23.9 | 30 | — | 335.6 | — | — | — | 23.7 | 30.4 | — | — |
| | (E-2) | — | — | — | — | — | — | 2.6 | — | — | — | 12 |
| (C) | as Pt weight | | | | | 2 ppm | | | | | | |
| | H/Vi | 1.0 | 1.1 | 3.5 | 1.8 | 2.5 | 1.2 | 0.6 | 1.0 | 1.1 | 3.5 | 1.2 |

TABLE 2

| | Test results | | | | | | | |
|---|---|---|---|---|---|---|---|---|
| | | Example | | | | | | |
| | | 12 | 13 | 14 | 15 | 16 | 17 | 18 |
| Hardness | Type A | 76 | 73 | 30 | — | 40 | 74 | 58 |
| | Type D | — | — | — | 45 | — | — | — |
| Full cure time (min) | 150° C. | 5 | 5 | 20 | 5 | 10 | 5 | 5 |
| Transmittance and heat resistance (% T) | 1 mm thick, 450 nm, 0 hr | 99.4 | 99.5 | 99.6 | 99.5 | 99.4 | 99.7 | 99.7 |
| | after 150° C. × 1,000 hr | 98.4 | 98.6 | 99.1 | 98.9 | 98.8 | 99.5 | 99.4 |

TABLE 2-continued

Test results

| | | Example | | | | | | |
|---|---|---|---|---|---|---|---|---|
| | | 12 | 13 | 14 | 15 | 16 | 17 | 18 |
| Tensile strength (MPa) | 25° C. | 4.2 | 3.4 | 0.6 | 6.1 | 1.1 | 3.6 | 2.2 |
| Elongation at break (%) | 25° C. | 80 | 100 | 180 | 60 | 140 | 50 | 80 |
| Gelling time (min) | 80° C. | 3 | 4 | 6.5 | 2 | 5.5 | 2.5 | 3.5 |
| Water vapor permeability (g/m² · day) | Lyssy analyzer | 18 | 21 | 26 | 14 | 23 | 55 | 61 |
| TCT (cracked samples) | −50° C.↔140° C., 1,000 cycles | 0/20 | 0/20 | 0/20 | 2/20 | 0/20 | 0/20 | 0/20 |

TABLE 3

Test results

| | | Comparative Example | | | |
|---|---|---|---|---|---|
| | | 1 | 2 | 3 | 4 |
| Hardness | Type A | 75 | 72 | 35 | 85 |
| Full cure time (min) | 150° C. | 40 | 70 | 60 | 25 |
| Transmittance and | 1 mm thick, 450 nm, 0 hr | 99.5 | 99.4 | 99.3 | 99.7 |
| heat resistance (% T) | after 150° C. × 1,000 hr | 96.4 | 98.4 | 96.0 | 99.5 |
| Tensile strength (MPa) | 25° C. | 4.1 | 3.2 | 0.3 | 5.1 |
| Elongation at break (%) | 25° C. | 60 | 80 | 180 | 30 |
| Gelling time (min) | 80° C. | 10 | 14.5 | 14 | 7 |
| Water vapor permeability (g/m² · day) | Lyssy analyzer | 20 | 21 | 28 | 45 |
| TCT (cracked samples) | −50° C.↔ 140° C., 1,000 cycles | 18/20 | 12/20 | 6/20 | 20/20 |

As seen from Tables 2 and 3, the silicone composition containing a hydrosilyl-containing organopolysiloxane having a plurality of terminal hydrosilyl groups in a common molecule with the scope of the invention provides a cured product within a short gelling time. The cured product has improved heat resistance. Since the hydrosilyl-containing organopolysiloxane has $R^2{}_2SiO_{2/2}$ units within its structure, the cured product of the composition containing the same is flexible and crack resistant.

In the silicone compositions of Example 12 and Comparative Example 1, both components (A) and (B) have aromatic groups. In the silicone composition of Example 6, neither of components (A) and (B) has aromatic groups. As seen from the test results, for the purpose of obtaining a cured product having lower gas permeability, it is preferred that both components (A) and (B), especially all components (A), (B), (D) and (E) have aromatic groups.

EXAMPLE 19

A silicone resin solution (silicone composition) was prepared by mixing 100 g of silicone fluid (A-1) with 4.5 g of hydrosilyl-containing organopolysiloxane (B-1), adding an amount of a 1,3-divinyl-1,1,3,3-tetramethyldisiloxane complex of chloroplatinic acid so as to give 5 ppm of platinum, and uniformly mixing them on a Thinky Conditioning Mixer (Thinky Corp.) for 1 minutes. The silicone resin solution was measured for viscosity at 23° C. by a Brookfield viscometer according to JIS Z 8803:2011, finding a viscosity of 6.1 Pa·s. Physical properties of the cured silicone composition were examined by the following tests.

(1) Hardness of Cured Product

The silicone composition was cast into an aluminum dish of 50 mm diameter and 10 mm thick, and cured stepwise at 60° C. for 1 hour, at 100° C. for 1 hour, and at 150° C. for 4 hours into a rubbery cured product. The cured product was measured for hardness by Durometer Type A according to JIS K 6253-3:2012. It had a hardness of 40 on Durometer Type A scale.

(2) Light Transmittance of Cured Product

A concave polytetrafluoroethylene spacer of 1 mm thick was sandwiched between two slide glass plates of 50 mm×20 mm×1 mm thick and fixedly secured. The silicone composition was cast into the space, and cured stepwise at 60° C. for 1 hour, at 100° C. for 1 hour, and at 150° C. for 4 hours. The cured sample was measured for light transmittance at wavelength 450 nm on a spectrometer U-4100 (Hitachi High-Technologies Corp.). It had a transmittance of 99.1% at 450 nm.

(3) Tensile Strength and Elongation at Break of Cured Product

The silicone composition was cast into a concave polytetrafluoroethylene mold of 150 mm×200 mm×2 mm thick and cured stepwise at 60° C. for 1 hour, at 100° C. for 1 hour, and at 150° C. for 4 hours. The cured sample was measured for tensile strength and elongation at break on a tensile tester EZ TEST (EZ-L by Shimadzu Corp.) according to JIS K 6251:2010 under conditions including a separation rate of 500 mm/min, a distance between grips of 80 mm, and a distance between two gage marks of 40 mm. It had a tensile strength of 1.5 MPa and an elongation at break of 80%.

Since the hydrosilyl-containing organopolysiloxane within the scope of the invention has a multiplicity of hydrosilyl groups subject to hydrosilylation, it not only serves as crosslinker in addition curable silicone resin compositions, but is also useful in many applications, for example, as a starting material for the preparation of various organic group-modified organopolysiloxanes. Particularly when the hydrosilyl-containing organopolysiloxane is used as crosslinker in addition curable silicone resin compositions, cured products of the silicone resin compositions are readily obtainable, suggesting that the hydrosilyl-containing organopolysiloxane is applicable to rubber products and semiconductor encapsulants.

The addition curable silicone resin composition within the scope of the invention provides a cured product within a short time, contributing to an improvement in productivity. Since the cured product exhibits high transparency, heat resistance, and crack resistance, the composition is best suited as a high reliability encapsulant for semiconductor chips.

Japanese Patent Application Nos. 2015-151748 and 2015-151780 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An organopolysiloxane having at least 4 terminal hydrosilyl groups per molecule, represented by the general formula (1):

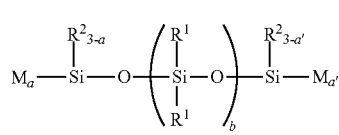

wherein $R^1$ is each independently a $C_1$-$C_6$ monovalent aliphatic hydrocarbon group or $C_6$-$C_{12}$ monovalent aromatic hydrocarbon group, $R^2$ is each independently hydrogen, a $C_1$-$C_6$ monovalent aliphatic hydrocarbon group or $C_6$-$C_{12}$ monovalent aromatic hydrocarbon group, M is each independently a group of the following formula:

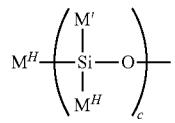

wherein $M^H$ is each independently a group of the following formula:

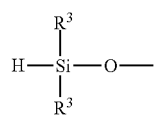

wherein $R^3$ is each independently a $C_1$-$C_6$ monovalent aliphatic hydrocarbon group or $C_6$-$C_{12}$ monovalent aromatic hydrocarbon group, M' is each independently a group represented by $R^2$ or $M^H$, c is an integer of 0 to 4, a and a' each are an integer of 0 to 3, with the proviso that a and a' are not equal to 0 at the same time, and b is an integer of 1 to 50.

2. The organopolysiloxane of claim 1 wherein in formula (1), 40 to 100 mol % of the total number of groups R' per molecule is a $C_6$-$C_{12}$ monovalent aromatic hydrocarbon group.

3. The organopolysiloxane of claim 2 wherein in formula (1), all groups $R^1$ per molecule are $C_6$-$C_{12}$ monovalent aromatic hydrocarbon groups.

4. The organopolysiloxane of claim 1 wherein in formula (1), b is an integer of 1 to 25.

5. The organopolysiloxane of claim 4 wherein in formula (1), b is an integer of 1 to 5.

6. A method for preparing the hydrosilyl-containing organopolysiloxane of claim 1, that is, organopolysiloxane having at least 4 terminal hydrosilyl groups per molecule, represented by the general formula (1), said method comprising the steps of:

effecting condensation reaction of an organosilicon compound having the general formula (2):

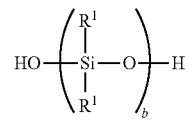

wherein $R^1$ and b are as defined above, with an organosilicon compound having the general formula (3):

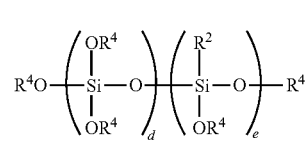

wherein $R^2$ is as defined above, $R^4$ is each independently hydrogen, a $C_1$-$C_6$ monovalent aliphatic hydrocarbon group or $C_6$-$C_{12}$ monovalent aromatic hydrocarbon group, d and e each are an integer of 0 to 4, and $1 \leq d+e \leq 4$, in the presence of a basic catalyst, and endcapping the reaction product with an organosilicon compound having the general formula (4) and/or (5):

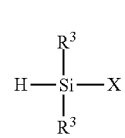

wherein $R^3$ is as defined above and X is a hydrolyzable group or hydroxyl group,

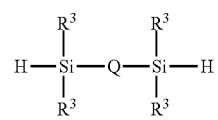

wherein $R^3$ is as defined above and Q is oxygen or —NH—.

7. An addition curable silicone composition comprising the following components (A) to (C):

(A) a linear organopolysiloxane having at least two alkenyl groups per molecule, represented by the formula (11):

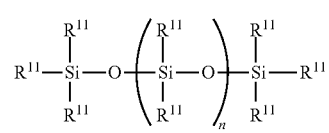

wherein $R^{11}$ is each independently a $C_1$-$C_{12}$ monovalent saturated hydrocarbon group, $C_6$-$C_{12}$ monovalent aromatic hydrocarbon group, or $C_2$-$C_{10}$ alkenyl group, at least two of groups $R^{11}$ being alkenyl, and n is an integer of 0 to 1,000, (B) an organopolysiloxane having at least 4 terminal hydrosilyl groups per molecule, represented by the formula (1):

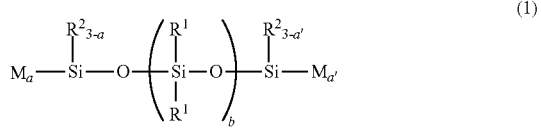
(1)

wherein $R^1$ is each independently a $C_1$-$C_6$ monovalent aliphatic hydrocarbon group or $C_6$-$C_{12}$ monovalent aromatic hydrocarbon group, $R^2$ is each independently hydrogen, a $C_1$-$C_6$ monovalent aliphatic hydrocarbon group or $C_6$-$C_{12}$ monovalent aromatic hydrocarbon group, M is each independently a group of the following formula:

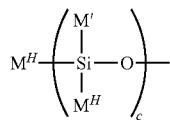

wherein $M^H$ is each independently a group of the following formula:

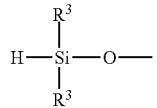

wherein $R^3$ is each independently a $C_1$-$C_6$ monovalent aliphatic hydrocarbon group or $C_6$-$C_{12}$ monovalent aromatic hydrocarbon group, M' is each independently a group represented by $R^2$ or $M^H$, c is an integer of 0 to 4, a and a' each are an integer of 0 to 3, with the proviso that a and a' are not equal to 0 at the same time, and b is an integer of 1 to 50, (C) a catalytic amount of a hydrosilylation catalyst.

8. The silicone composition of claim 7, further comprising (D) an organopolysiloxane of network structure having at least 2 alkenyl groups per molecule, represented by the formula (12):

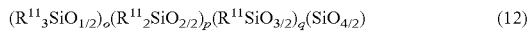
(12)

wherein $R^{11}$ is as defined above, at least two of groups $R^{11}$ being alkenyl, o is an integer of 0 to 100, p is an integer of 0 to 300, q is an integer of 0 to 200, r is an integer of 0 to 200, $1 \le q+r \le 400$, $2 \le o+p+q+r \le 800$, o, p, q and r have such values that the organopolysiloxane has at least two alkenyl groups per molecule, component (D) being present in such an amount of 5 to 900 parts by weight per 100 parts by weight of component (A) that a ratio of the total number of hydrosilyl groups in component (B) to the total number of alkenyl groups in components (A) and (D) is 0.4/1 to 4/1.

9. The silicone composition of claim 7, further comprising (E) a linear organohydrogenpolysiloxane represented by the formula (13):

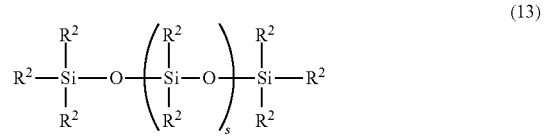
(13)

wherein $R^2$ is as defined above, at least two of groups $R^2$ being hydrogen, s is an integer of 0 to 100, component (E) being present in such an amount that a ratio of the total number of hydrosilyl groups in components (B) and (E) to the total number of alkenyl groups in component (A) or components (A) and (D) is 0.4/1 to 4/1, and in an amount of 10 to 99% by weight based on the total weight of components (B) and (E).

10. The silicone composition of claim 7 wherein in formula (1), 40 to 100 mol % of the total number of groups $R^1$ per molecule is a $C_6$-$C_{12}$ monovalent aromatic hydrocarbon group.

11. The silicone composition of claim 10 wherein in formula (1), all groups $R^1$ per molecule are $C_6$-$C_{12}$ monovalent aromatic hydrocarbon groups.

12. The silicone composition of claim 7 wherein in formula (1), b is an integer of 1 to 25.

13. The silicone composition of claim 12 wherein in formula (1), b is an integer of 1 to 5.

14. A semiconductor package comprising a cured product obtained by curing the addition curable silicone composition of claim 7.

* * * * *